(12) United States Patent
Ocker

(10) Patent No.: US 11,475,935 B1
(45) Date of Patent: Oct. 18, 2022

(54) MEMORY CELL ARRANGEMENT AND METHODS THEREOF

(71) Applicant: Ferroelectric Memory GmbH, Dresden (DE)

(72) Inventor: Johannes Ocker, Dresden (DE)

(73) Assignee: FERROELECTRIC MEMORY GMBH, Dresden (DE)

( * ) Notice: Subject to any disclaimer, the term of this patent is extended or adjusted under 35 U.S.C. 154(b) by 0 days.

(21) Appl. No.: 17/341,880

(22) Filed: Jun. 8, 2021

(51) Int. Cl.
*G11C 11/22* (2006.01)

(52) U.S. Cl.
CPC ........ *G11C 11/2275* (2013.01); *G11C 11/221* (2013.01); *G11C 11/223* (2013.01)

(58) Field of Classification Search
CPC .............................. G11C 11/22; G11C 11/2275
USPC .......................................................... 365/145
See application file for complete search history.

(56) References Cited

U.S. PATENT DOCUMENTS

| 6,760,246 | B1 * | 7/2004 | Kamp | ..................... G11C 11/22 365/65 |
| 2017/0162250 | A1 * | 6/2017 | Slesazeck | ............. G11C 11/223 |
| 2018/0366477 | A1 * | 12/2018 | Liu | ....................... G11C 11/221 |

OTHER PUBLICATIONS

Ocker, U.S. Appl. No. 17/341,884, filed Jun. 8, 2021, Notice of Allowance and Fees Due, dated Apr. 4, 2022.

\* cited by examiner

*Primary Examiner* — Muna A Techane
(74) *Attorney, Agent, or Firm* — Hickman Becker Bingham Ledesma LLP; Malgorzata A. Kulczycka

(57) ABSTRACT

Various aspects relate to a memory cell arrangement including: a memory cell including a field-effect transistor structure and a spontaneous-polarizable memory layer; and a control circuit configured to cause a writing of the memory cell by a writing operation, the writing operation including: carrying out a writing sequence including: supplying a write signal set to the memory cell to provide a write voltage drop to bring a threshold voltage of the memory cell into a target range by polarizing the memory layer, and, subsequently, supplying a post-conditioning signal set to the memory cell to provide a post-conditioning voltage drop having opposite polarity with respect to the write voltage drop to change the threshold voltage by partially depolarizing the memory layer; and checking whether the threshold voltage is in the target range, and repeating the writing sequence in the case that the threshold voltage is not in the target range.

20 Claims, 10 Drawing Sheets

MEMORY CELL ARRANGEMENT AND METHODS THEREOF

TECHNICAL FIELD

Various aspects relate to a memory cell arrangement, a memory cell, and methods thereof (e.g., a method of writing a memory cell).

BACKGROUND

In general, various computer memory technologies have been developed in the semiconductor industry. A fundamental building block of a computer memory may be referred to as memory cell. The memory cell may be an electronic circuit that is configured to store at least one information (e.g., bitwise). The information stored in the memory cell may be obtained by determining in which of the possible memory states the memory cell is residing in. At present, various types of memory cells may be used to store data. By way of example, a type of memory cell may include a thin film of ferroelectric material, whose polarization state may be changed in a controlled fashion to store data in the memory cell, e.g. in a non-volatile manner. The memory cells may be integrated, for example, on a wafer or a chip together with one or more logic circuits.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

Figure 1:
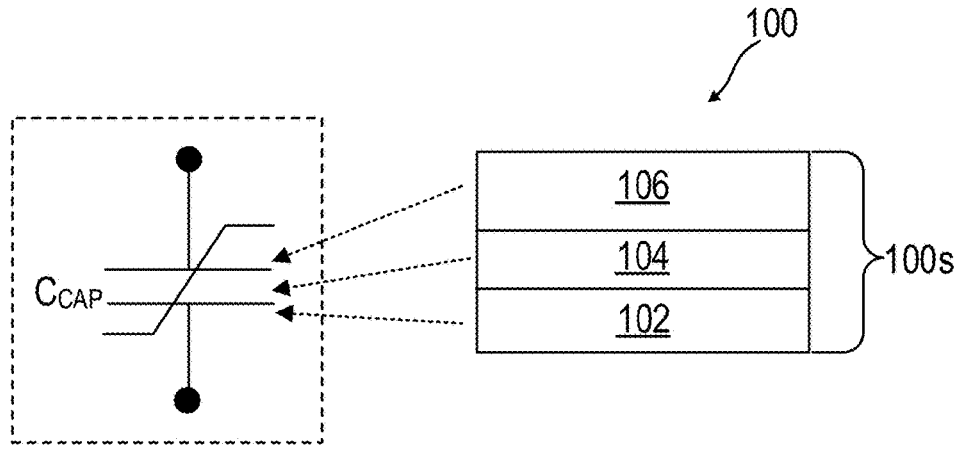
FIG. 1 shows schematically a capacitive memory structure, according to various aspects.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices (e.g., a memory cell arrangement, a memory cell, or a control circuit). However, it may be understood that aspects described in connection with methods may similarly apply to the devices, and vice versa.

The terms "at least one" and "one or more" may be understood to include any integer number greater than or equal to one, i.e. one, two, three, four, [ ... ], etc. The term "a plurality" or "a multiplicity" may be understood to include any integer number greater than or equal to two, i.e. two, three, four, five, [ ... ], etc. The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

In the semiconductor industry, the integration of non-volatile memory technologies may be useful for System-on-Chip (SoC) products like microcontrollers (MCU), etc. According to various aspects, a non-volatile memory may be integrated next to a processor core of a processor. As another example, one or more non-volatile memories may be used as part of a mass storage device. In some aspects, a non-volatile memory technology may be based on at least one field-effect transistor (FET) structure. In some aspects, a memory cell may include a field-effect transistor structure and a capacitive memory structure (also referred to herein as memory capacitor) coupled to the field-effect transistor structure. The amount of charge stored in the capacitive memory structure may influence the threshold voltage(s) of the field-effect transistor structure. The threshold voltage(s) of the field-effect transistor structure may define the memory state the memory cell is residing in. In some aspects, the capacitive memory structure may be a ferroelectric capacitor structure (FeCAP) coupled to a gate electrode of the field-effect transistor structure to provide a ferroelectric field-effect transistor (FeFET) structure. Since a ferroelectric material may have at least two stable polarization states, it may be used to shift a threshold voltage of a field-effect transistor in a non-volatile fashion; therefore, it may be used to turn the field-effect transistor into a non-volatile field-effect transistor based memory structure. In other aspects, a non-volatile memory technology may be based on at least one capacitive memory structure. The capacitive memory structure may be or may include a ferroelectric capacitor structure. A ferroelectric material may turn a ferroelectric capacitor structure into a non-volatile capacitor-based memory structure, e.g. by controlling the amount of charge stored in the capacitor structure. The amount of charge stored in the capacitive memory structure may be read out by suitable electronic readout circuits, e.g., by a charge to voltage converter, by a determination of a switching current of the capacitive memory structure.

The terms "spontaneously polarized", "spontaneous-polarizable", or "spontaneous polarization" may be used herein with reference to the polarization capability of a material beyond dielectric polarization. The coercivity of a material may be a measure of the strength of the reverse polarizing electric field that may be required to remove a remanent polarization if present. A spontaneous polarization (e.g., a remanent or non-remanent spontaneous polarization) may be evaluated via analyzing one or more hysteresis measurements (e.g., hysteresis curves), e.g., in a plot of polarization, P, versus electric field, E, in which the material is polarized into opposite directions. The polarization capability of a material (dielectric polarization, spontaneous polarization, and a remanence characteristic of the polarization) may be analyzed using capacity spectroscopy, e.g., via a static (C-V) and/or time-resolved measurement or by polarization-voltage (P-V) or positive-up-negative-down (PUND) measurements.

The term "spontaneously polarizable material" or "spontaneous-polarizable material" may be used herein with reference to a material that has a polarization capability in addition to its dielectric polarization capability. A spontaneous-polarizable material may be or may include a spontaneous-polarizable material that shows a remanence, e.g., a ferroelectric material, and/or a spontaneous-polarizable material that shows no remanence, e.g., an anti-ferroelectric material.

The term "remanent-polarizable" or "remanently polarizable" with reference to a layer, a portion, a structure, a memory cell, as examples, may be understood as a layer that exhibits a remanent-polarization capability (e.g., in addition to a dielectric polarization capability and/or a non-remanent-polarization capability). A remanent-polarizable layer, a remanent-polarizable structure, a remanent-polarizable memory cell, a remanent-polarizable portion (only as examples) may include, in some aspects, a material that is remanently polarizable (i.e., that shows a remanence of the spontaneous polarization), e.g., a ferroelectric material. In other aspects, a remanent-polarizable layer, a remanent-polarizable structure, a remanent-polarizable memory cell, a remanent-polarizable portion (only as examples) may include a material that is spontaneous-polarizable and that shows no remanence, e.g., an anti-ferroelectric material under the additional conditions, that measures are implemented to generate an internal electric-field within the anti-ferroelectric material. An internal electric-field within an anti-ferroelectric material may be caused (e.g., applied, generated, maintained, as examples) in various ways, e.g., by implementing floating nodes that may be charged to voltages different from zero volts, e.g., by implementing charge storage layers, e.g., by using doped layers, e.g., by using electrode layers that adapt electronic work-functions to generate an internal electric field, only as examples.

In the following, various aspects of a memory cell and/or a capacitive memory structure are described with reference to exemplary types of memory cells and/or capacitive memory structures. It is understood that, in general, a memory structure (e.g., a spontaneous-polarizable memory structure) as described herein may be a functional component that allows providing various types of memory cells, e.g., a capacitive memory cell as exemplarily illustrated in FIG. 1, e.g., a field-effect transistor based capacitive memory cell, as exemplarily illustrated in FIG. 2, or any other type of memory cell. According to various aspects, a memory structure may include one or more electrodes and at least one memory layer coupled to the one or more electrodes, the memory layer including a spontaneous-polarizable material. In some aspects, a memory structure may be or may include any type of a capacitive memory structure ($C_{CAP}$). A capacitive memory structure itself may be understood as a memory cell, e.g., an array of capacitive memory structures may be addressed via control lines as a memory cell arrangement (e.g., in a crossbar arrangement). In other aspects, a capacitive memory structure may be used in combination with a transistor, e.g., a FET having its gate coupled to an electrode of the capacitive memory structure, or a capacitive memory structure included in a gate structure of the FET, as a memory cell.

The overall polarization of a memory layer (e.g., the overall remanent polarization of a spontaneous-polarizable memory layer) may be defined by the individual contributions of the grains forming the layer (see, for example, FIG. 3A to FIG. 3D). Illustratively, a memory layer being in a polarization state may be understood as a combination (e.g., a sum, or an overlay) of the individual polarizations of the grains forming the memory layer defining that polarization state, e.g. the combination of the individual polarizations may define an overall positive polarization or an overall negative polarization.

Various aspects may be based on the realization that some of the grains of a memory layer may be in an unstable polarization state, e.g. may be in a state that is not robust against switching, which may lead to reduced data retention capabilities. Illustratively, one or more grains may be in a polarization state (e.g., contributing to the overall positive or negative polarization of the memory layer), which may be easily switched in the opposite direction, for example in the case that the grain experiences a (even small) electric field. The undesired switching of the polarization state of some of the grains may cause a reduction of the overall polarization of the memory layer, e.g. a progressive reduction of the magnitude of the polarization (as a function of how many grains have flipped), and ultimately to an undesired inversion of the polarization state of the memory layer (e.g., in the case that enough grains have flipped the respective polarization state). The progressive reduction of the polarization of a memory layer may lead to failures when reading out the memory state a memory cell is residing in, e.g. in the case that the magnitude of the polarization of the memory layer is no longer sufficient to define the desired threshold voltage associated with that memory state, and may ultimately lead to the wrong data being read out (e.g., a logic "0" instead of a logic "1", or vice versa) in the case that a large number of grains have switched the respective polarization state.

The term "switch" may be used herein to describe a modification of a polarization, for example of a spontaneous-polarizable memory layer. For example, a polarization of a spontaneous-polarizable memory layer may be switched, such that the polarization varies from pointing towards a first direction to pointing towards the opposite (e.g., second) direction, e.g. the sign of the polarization varies from positive to negative or from negative to positive, while the absolute value of the polarization may remain in some aspects substantially unaltered. As another example, a polarization of a grain forming a spontaneous-polarizable memory layer may be switched, such that the sign of the polarization varies from positive to negative or from negative to positive. The term "switch" may also be used herein to describe a modification of the memory state a memory cell is residing in. For example, in the case that a memory cell is residing in a first memory state (e.g., a LVT state), the memory state the memory cell is residing in may be switched such that, after the switch, the memory cell may reside in a second memory state (e.g., a HVT state), different from the first memory state. The term "switch" may thus be used herein to describe a modification of the memory state a memory cell is residing in, from a first memory state to a second memory state. The terms "flip", "flipped", or "flipping" may be used herein in a same manner as the terms "switch", "switched", or "switching".

In various aspects a writing operation is provided, which is adapted to ensure that a memory layer (after the writing operation is concluded) has an increased robustness against undesired flipping of the polarization state of the grains forming the layer. This may provide improved data retention capabilities. The writing operation (also referred to herein as adapted writing operation, or post-conditioning writing operation) may be configured to preemptively induce a flipping of the polarization state of the unstable grains, thus providing a memory state (e.g., a polarization state) defined only by the contributions of the stable grains, leading to a more stable data retention over time.

Various aspects are related to a control circuit that is configured to efficiently carry out writing operations based on the post-conditioning writing scheme (referred to in the following as post-conditioning scheme for brevity). The post-conditioning scheme may illustratively include providing a voltage drop at the memory cell(s) intended to be written in such a way that any weakly polarized grain may be flipped (without flipping the overall polarization state of the memory layer), thus leaving only the strongly polarized grains to define the memory state. The post-conditioning scheme may induce a controlled partial depolarization of the spontaneous-polarizable memory layer of a memory cell, to ensure that the overall polarization is defined by the individual polarizations of grains that are not easily flipped (e.g., flipped by external disturbs). In some aspects, the post-conditioning scheme may induce a controlled reduction of the threshold voltage associated with a memory cell (e.g., in case the memory cell includes a field-effect transistor structure), to ensure that the threshold voltage resulting from a (completed) writing operation remains stable over time (in view of the memory layer being free of unstably polarized grains).

The post-conditioning scheme may include bringing a memory cell into a desired memory state and providing a post-conditioning voltage drop at the memory cell in such a way that the memory cell may be substantially free of grains having a relatively weak polarization state, e.g. in such a way that grains having an unstable polarization state are (already) flipped during the writing operation. Post-conditioning may be understood as influencing the properties (e.g., the polarization properties) of a memory cell after the memory state of the memory cell has been switched (illustratively, after the memory cell has been brought into a (new) desired memory state).

According to various aspects, a memory cell arrangement may include: at least one memory cell including a spontaneous-polarizable memory layer, the spontaneous-polarizable memory layer including one or more grains; and a control circuit configured to cause a writing of the at least one memory cell by a (adapted) writing operation, wherein the writing operation includes inducing a partial depolarization of the spontaneous-polarizable memory layer to increase the robustness of the at least one memory cell against undesired flipping of the respective polarization state of the one or more grains.

According to various aspects, a memory cell arrangement may include: a memory cell including a field-effect transistor structure and a spontaneous-polarizable memory layer; and a control circuit configured to cause a writing of the memory cell by a writing operation, wherein the writing operation includes: carrying out a writing sequence, the writing sequence including: supplying a write signal set to the memory cell to provide a write voltage drop to bring a threshold voltage associated with the memory cell into a target threshold voltage range by polarizing the spontaneous-polarizable memory layer, and, subsequently, supplying a post-conditioning signal set (also referred to herein as disturb signal set) to the memory cell to provide a post-conditioning voltage drop (also referred to herein as disturb voltage drop) having opposite polarity with respect to the write voltage drop to reduce the threshold voltage associated with the memory cell by partially depolarizing the spontaneous-polarizable memory layer; and checking, after carrying out the writing sequence, whether the threshold voltage associated with the memory cell is in the target threshold voltage range, and repeating the writing sequence in the case that the threshold voltage associated with the memory cell is not in the target threshold voltage range.

According to various aspects, a memory cell arrangement may include: a memory cell including a spontaneous-polarizable memory layer, and a control circuit configured to cause a writing of the memory cell by a single writing operation, wherein the single writing operation includes: carrying out a writing sequence, the writing sequence including: supplying a write signal set to the memory cell to provide a write voltage drop to bring the memory cell in a memory state by polarizing the spontaneous-polarizable memory layer, and, subsequently, supplying a post-conditioning signal set to the memory cell to provide a post-conditioning voltage drop having opposite polarity with respect to the write voltage drop to partially depolarize the spontaneous-polarizable memory layer; and checking, after carrying out the writing sequence, whether the memory cell still resides in the memory state, and either repeating the writing sequence and the checking in the case that the memory cell does not reside in the memory state, or ending the writing operation by repeating only the writing sequence in the case that the memory cell resides in the memory state.

According to various aspects a method of writing a memory cell is provided, the method including: bringing a memory cell into a memory state of at least two memory states by applying a write signal set to the memory cell; verifying a robustness of the memory state by applying a disturb signal set to the memory cell after the memory cell is brought into the memory state; and either ending the writing of the memory cell in the case that the robustness of the memory state is verified or applying a further write signal set to the memory cell to bring the memory cell into a more robust memory state.

The term "voltage" may be used herein with respect to "one or more write voltages", "one or more post-conditioning voltages", "one or more disturb voltages", "one or more gate voltages", "a base voltage", "one or more source/drain voltages", and the like. As an example, the term "gate voltage" may be used herein to denote a voltage that is provided at a gate node or a gate terminal of a transistor or a memory cell, as examples. As another example, the term "base voltage" may be used herein to denote a reference voltage and/or a reference potential for the circuit. With respect to an electrical circuit, the base voltage may be also referred to as ground voltage, ground potential, virtual ground voltage, or zero volts (0 V). The base voltage of an electrical circuit may be defined by the power supply used to operate the electronic circuit. As another example, the term "source/drain voltage" may be used herein to denote a voltage that is provided at a source/drain node or a source/drain terminal of a transistor or a memory cell, as examples.

A voltage provided at a node of the circuit may be defined by the respective potential applied to that node relative to the base voltage (referred to as VB) of the circuit. Further, a voltage drop provided at a certain element (e.g., at a memory cell, at a capacitive memory structure, at a field-effect transistor structure, etc.) may describe a difference between two voltages/potentials provided at the element, e.g., provided directly or indirectly. As an example, a voltage drop provided at an element may include a difference between two voltages/potentials provided at two different nodes or terminals of the element. As another example, a voltage drop provided at an element may include a difference between two voltages/potentials provided at two different locations in a circuit that lead to a voltage drop occurring over the element (e.g., via one or more additional elements). For example, a voltage drop associated with two distinct nodes of a circuit may be defined by the respective voltages/potentials applied at the two nodes. As an example, a gate-source voltage drop associated with a gate structure (e.g. of a transistor or a memory cell) may be defined by the respective voltages/potentials applied at the corresponding gate node and source node of the gate structure. The gate-source voltage drop may also be referred to as gate-source voltage, $V_{GS}$. In the case that the source voltage is zero, as used for example in conventional driving schemes for writing and/or reading of a field-effect transistor based memory cell, the gate source voltage drop and the gate source voltage, $V_{GS}$, may be referred to as gate voltage, $V_G$.

In some aspects, two voltages (e.g., two threshold voltages) may be compared with one another by relative terms such as "greater", "higher", "lower", "less", or "equal", for example. It is understood that, in some aspects, a comparison may include the sign (positive or negative) of the voltage value or, in other aspects, the absolute voltage values (also referred to as the magnitude, or as the amplitude, e.g. of a voltage pulse) may be considered for the comparison. As an example, an n-type or p-type field-effect transistor based memory cell may have a first threshold voltage, also referred to as low threshold voltage ($V_{L-th}$), and a second threshold voltage, also referred to as high threshold voltage ($V_{H-th}$). In the case of the n-type field-effect transistor (n-FET) based memory cell, the high threshold voltage, $V_{H-th}$, may be greater than the low threshold voltage, $V_{L-th}$, both with respect to the voltage value and the absolute voltage value (e.g. the $V_{L-th}$ may be 1 V and the $V_{H-th}$ may be 3 V, only as numerical examples), or the high threshold voltage, $V_{H-th}$, may be greater than the low threshold voltage, $V_{L-th}$, only with respect to the voltage value (e.g. the $V_{L-th}$ may be −1 V and the $V_{H-th}$ may be 1 V, or the $V_{L-th}$ may be −2 V and the $V_{H-th}$ may be 0 V, or the $V_{L-th}$ may be −3 V and the $V_{H-th}$ may be −1 V, only as numerical examples). In the case of the p-type field-effect transistor (p-FET) based memory cell, the high threshold voltage, $V_{H-th}$, may be lower than the low threshold voltage, $V_{L-th}$, with respect to the voltage value and higher than the low threshold voltage, $V_{L-th}$, with respect to the absolute voltage value (e.g. the $V_{L-th}$ may be −1 V and the $V_{H-th}$ may be −3 V, only as numerical examples), or the high threshold voltage, $V_{H-th}$, may be lower than the low threshold voltage, $V_{L-th}$, only with respect to the voltage value (e.g., the $V_{L-th}$ may be 1 V and the $V_{H-th}$ may be −1 V, or the $V_{L-th}$ may be 2 V and the $V_{H-th}$ may be 0 V, or the $V_{L-th}$ may be 3 V and the $V_{H-th}$ may be 1 V, only as numerical examples).

FIG. 1 shows a schematic functioning of a capacitive memory structure 100, according to various aspects. The capacitive memory structure 100 may include one or more electrodes 102, 106 (e.g., one or more electrode layers, e.g. a first electrode 102 and a second electrode 106 in the exemplary configuration in FIG. 1) and a memory element 104 coupled to the one or more electrodes 102, 106. The memory element 104 may include or may be a memory layer disposed between two electrode layers. The memory element 104 may include or may consist of a spontaneous-polarizable material. Therefore, the capacitive memory structure 100 may have a capacitance, $C_{CAP}$, associated therewith. The one or more electrodes 102, 106 (e.g., the two electrodes 102, 106 in a capacitor arrangement) and the memory element 104 may form a memory layer stack 100s. In some aspects, the memory layer stack 100s may be a planar layer stack; however, other shapes may be suitable as well, e.g., curved shapes, angled shapes, coaxially aligned shapes, as examples.

Figure 6:
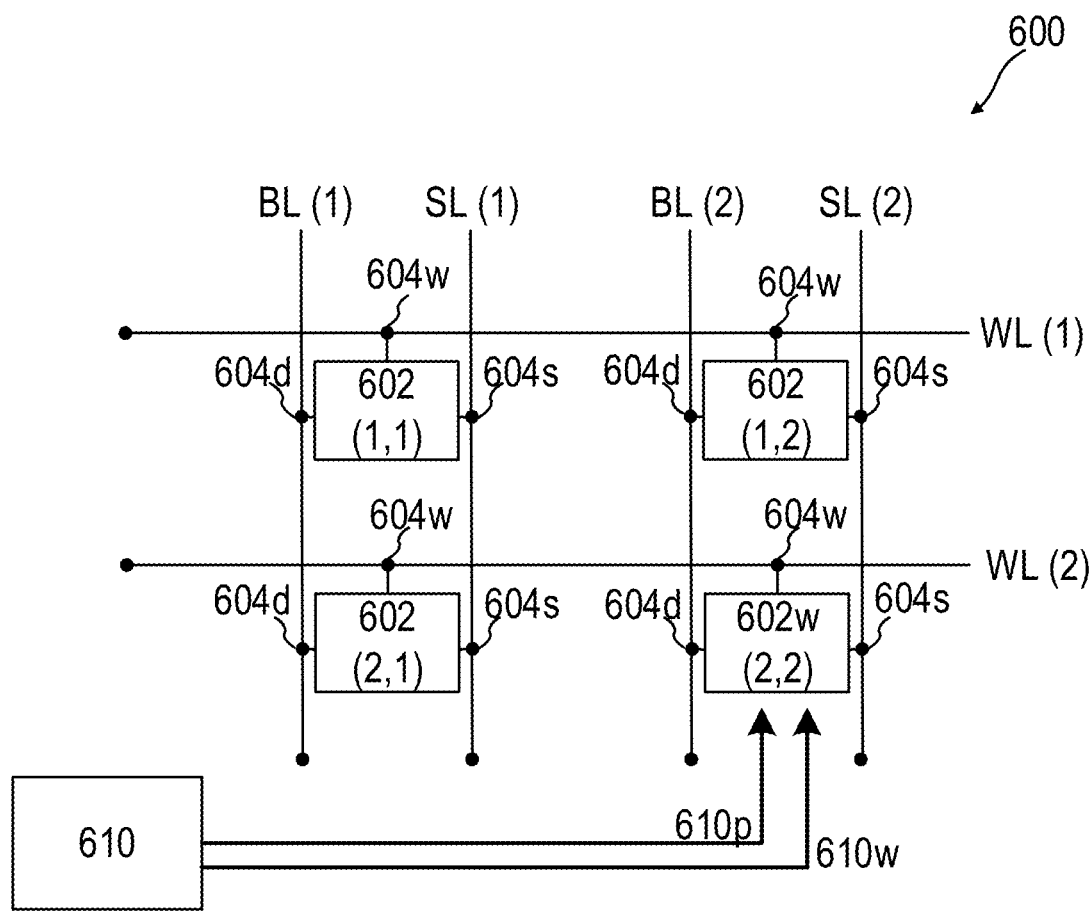
FIG. 6 shows schematically a memory cell arrangement including one or more memory cells according to various aspects.

In some aspects, the capacitive memory structure 100 itself may be used as a memory cell in a memory cell arrangement (e.g., in the memory cell arrangement described in relation to FIG. 6). In other aspects, the capacitive memory structure 100 may be coupled to or integrated in another device, e.g., a field-effect transistor, and the combination of the capacitive memory structure 100 and the other device may be used as a memory cell in a memory cell arrangement. A memory element that includes or consists of a spontaneous-polarizable material may be referred to as spontaneous-polarizable memory element. A memory layer that includes or consists of a spontaneous-polarizable material may be referred to as spontaneous-polarizable memory layer. According to various aspects, a memory element 104 may include one or more memory layers. According to various aspects, a spontaneous-polarizable memory element 104 may include one or more spontaneous-polarizable memory layers.

The at least one memory element 104 may include any type of spontaneous-polarizable material, e.g., a ferroelectric material, an anti-ferroelectric material, an anti-ferroelectric-like material, etc. The at least one memory element 104 may be the memory layer of the capacitive memory structure 100 to store, for example, an information via at least two remanent polarization states of the at least one memory element 104. The programming of the capacitive memory structure 100 (illustratively the storage of information therein) may be carried out by providing an electric field at the capacitive memory structure, e.g. an electric field between the first electrode 102 and the second electrode 106 (e.g., an electric potential difference between a first node and a second node associated with the first electrode 102 and the second electrode 106, respectively) to thereby set or change the remanent polarization state of the at least one memory element 104.

The capacitive memory structure 100 including the memory element 104 may be used to implement memory functions. The feature and functionalities described herein with reference to a memory cell, e.g., with reference to a FeFET, may be implemented in the same or in a similar way in a capacitive memory structure 100, e.g., in a FeCAP, that can act as a memory cell.

In various aspects, the polarization state of the spontaneous-polarizable memory layer 104 may be switched by means of the capacitor structure. The polarization state of the spontaneous-polarizable memory layer 104 may also be read out by means of the capacitor structure. The polarization state of the spontaneous-polarizable memory layer 104 may define a memory state. As an example, the polarization state of the spontaneous-polarizable memory layer 104 may determine the amount of charge stored in the capacitor structure. The amount of charge stored in the capacitor structure may be used to define a memory state (e.g., first amount of charge, for example less than 500 μC (but not limited to such a value), stored in the capacitor structure may define a first memory state, such as a LVT state, and a second amount of charge, for example greater than 500 μC (but not limited to such a value), stored in the capacitor structure may define a second memory state, such as a LVT state). For example, a memory cell including the capacitive memory structure 100 may operate without having a field-effect transistor structure included in the memory cell, e.g. without basing the operation on a variation of a threshold voltage of a field-effect transistor structure.

In various aspects, the readout of the memory state of a memory cell including a capacitive memory structure 100 may include a destructive readout. The readout may include bringing the memory cell (e.g., the capacitive memory structure 100) into a predefined memory state and evaluating the amount of a readout current output from the capacitive memory structure 100. Illustratively, the readout may include providing a readout voltage drop at the capacitive memory structure 100 (e.g., a readout voltage drop over the memory layer 104) to bring the memory layer 104 into a predefined polarization state (e.g., a polarization state associated with a logic "0", as an example). In the case that the memory layer 104 was already residing in the predefined polarization state, a first amount of readout current from the capacitive memory structure 100 may be measured (e.g., a relatively lower amount, in view of the fact that the polarization of the memory layer is not flipped). In the case that the memory layer 104 was residing in a polarization state other than the predefined polarization state (e.g., in the opposite state, for example associated with a logic "1"), a second amount of readout current from the capacitive memory structure 100 may be measured (e.g., a relatively greater amount, in view of the fact that the polarization of the memory layer is flipped, providing a (stronger) depolarization current). The memory state the capacitive memory structure 100 was residing in may be determined as a function of the output current. After the readout, the capacitive memory structure 100 may be written again in the state it was residing in prior to the readout, e.g. in case the memory layer 104 was in a polarization state other than the predefined polarization state. The readout current output by a capacitive memory structure 100 during a (destructive) readout may also be referred to herein as displacement current or (de-)polarization current.

Figure 2:
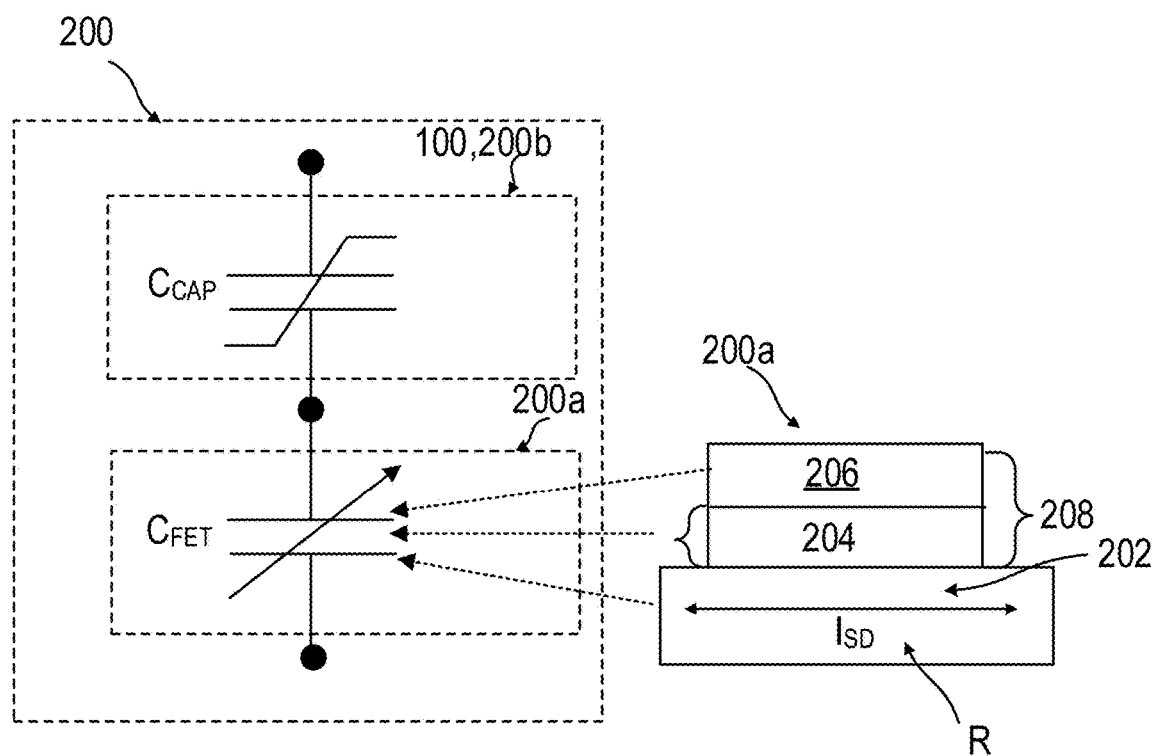
FIG. 2 shows schematically an equivalent circuit diagram of a memory cell including a capacitive memory structure, according to various aspects.

FIG. 2 shows a circuit equivalent of a memory cell 200 including a field-effect transistor structure 200a and a capacitive memory structure 200b, according to various aspects. The capacitive memory structure 200b may be configured as described with reference to the capacitive memory structure 100 illustrated in FIG. 1, e.g., including one or more electrodes 102, 106 and a memory element 104 coupled to the one or more electrodes 102, 106 (for example, including a first electrode 102, a second electrode 106, and a spontaneous-polarizable memory layer 104 disposed between the first electrode 102 and the second electrode 106). In some aspects, the field-effect transistor structure 200a (e.g., a gate stack 208, also referred to as gate structure) may be coupled to the capacitive memory structure 200a. In other aspects, the capacitive memory structure 200b may be integrated in the field-effect transistor structure 200a, e.g. within the gate stack 208 of the field-effect transistor structure 200a. The field-effect transistor structure 200a may include a gate structure 208, wherein the gate structure 208 may include a gate isolation 204 and a gate electrode 206. The gate structure 208 is illustrated exemplarily as a planar gate stack; however, it may be understood that the planar configuration shown in FIG. 2 is an example, and other field-effect transistor designs may include a gate structure 208 with a non-planar shape, for example a trench gate transistor design, a vertical field-effect transistor design, or other designs. The gate structure 208 may define a channel region 202, e.g., provided in a semiconductor portion (e.g., in a semiconductor layer, in a semiconductor die, etc.). The gate structure 208 may allow for a control of an electrical behavior (e.g., a resistance R) of the channel region 202, e.g., a current flow in the channel region 202 may be controlled (e.g., allowed, increased, prevented, decreased, etc.). In some aspects, the gate structure 208 may, for example, allow to control (e.g., allow or prevent) a source/drain current, $I_{SD}$, from a first source/drain region of the field-effect transistor structure 200a to a second source/drain region of the field-effect transistor structure 200a (the source/drains are provided in or adjacent to the channel but are not shown in FIG. 2). The channel region 202 and the source/drain regions may be formed, e.g., via doping one or more semiconductor materials or by the use of intrinsically doped semiconductor materials, within a layer and/or over a layer. With respect to the operation of the field-effect transistor structure 200a, a voltage may be provided at the gate electrode 206 to control the current flow, $I_{SD}$, in the channel region 202, the current flow, $I_{SD}$, in the channel region 202 being caused by voltages supplied via the source/drain regions. The gate electrode 206 may include an electrically conductive material (e.g., a metal material). In some aspects, the gate electrode 206 may be coupled to the capacitive memory structure 200b (e.g., may be coupled to an electrode, e.g. to the first electrode 102, of the capacitive memory structure). According to various aspects, the gate isolation 204 may be configured to provide an electrical separation of the gate electrode 206 from the channel region 202 and further to influence the channel region 202 via an electric field generated by the gate electrode 206. The gate isolation 204 may include one or more electrically insulating layers, as an example.

As an example, the gate electrode 206 of the field-effect transistor structure 200a may be electrically conductively connected to the first electrode of the capacitive memory structure 200b via an electrically conductive (e.g., ohmic) connection. As another example, the first electrode of the capacitive memory structure 200b may be in direct physical contact with the gate electrode 206 of the field-effect transistor structure 200a. As a further example, the capacitive memory structure 200b and the field-effect transistor structure 200a may share a common electrode acting as gate electrode of the field-effect transistor structure 200a and as electrode of the capacitive memory structure 200b.

As illustrated by the circuit equivalent in FIG. 2, a first capacitance, $C_{FET}$, may be associated with the field-effect transistor structure 200a. Illustratively, the channel region 202, the gate isolation 204, and the gate electrode 206 may have a capacitance, $C_{FET}$, associated therewith, originating from the more or less conductive regions (the channel region 202 and the gate electrode 206) separated from one another by the gate isolation 204. The channel region 202 may be considered as a first capacitor electrode, the gate electrode 206 as a second capacitor electrode, and the gate isolation 204 as a dielectric medium between the two capacitor electrodes. In some aspects, the field-effect transistor structure 200a and the capacitive memory structure 100, 200b may be coupled (e.g., electrically connected) to one another such that a capacitive voltage divider is provided, as illustrated by the circuit equivalent in FIG. 2. The channel or bulk node of the field-effect transistor structure 200a may provide or may be connected to a first node, an electrode of the capacitive memory structure 100, 200b may provide or may be connected to a second node, and an intermediate conductive portion (electrode, layer, etc.) may provide or may be connected to a floating intermediate node.

In some aspects, the memory layer of the capacitive memory structure 200b may be a spontaneous-polarizable memory layer. In general, a remanent polarization (also referred to as retentivity or remanence) may be present in a material layer in the case that the material layer may remain polarized upon reduction of an applied electric field (E) to zero, therefore, a certain value for the electrical polarization (P) of the material layer may be detected. Illustratively, a polarization remaining in a material when the electric field is reduced to zero may be referred to as remanent polarization (also referred to herein as residual polarization). Therefore, the remanence of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to describe remanent magnetization in magnetic materials.

According to various aspects, a ferroelectric material may be used as part of a capacitive memory structure of a memory cell (e.g., as part of the capacitive memory structure 100, or of the capacitive memory structure 200*b* of the memory cell 200). A ferroelectric material may be an example of material of a spontaneous-polarizable memory layer (e.g., of the memory element 104). Illustratively, ferroelectric materials may be used to store data in non-volatile manner in integrated circuits. The term "ferroelectric" may be used herein, for example, to describe a material that shows a hysteretic charge voltage relationship (Q-V). Doped or substituted hafnium oxide ($HfO_2$), doped or substituted zirconium oxide ($ZrO_2$) or, more in general, transition-metal-oxides (TMO) and their mixtures may show great remanent polarization under certain process conditions (e.g., $Hf_{0.5}Zr_{0.5}O_2$ may possess strong ferroelectric properties). However, the choice of material for a spontaneous-polarizable memory layer is not limited to ferroelectric materials.

The material of a spontaneous-polarizable memory layer (e.g., of a capacitive memory structure 100, and/or of a memory cell 200) may be or may include at least one of the following: a doped transition metal oxide, an undoped transition metal oxide, a doped transition metal nitride, an undoped transition metal nitride, a doped metal nitride (e.g., aluminum nitride), and/or an undoped metal nitride. As an example, the material of a spontaneous-polarizable memory layer may be or may include hafnium oxide (ferroelectric hafnium oxide, $HfO_2$), zirconium oxide (ferroelectric zirconium oxide, $ZrO_2$), and/or a (ferroelectric) mixture of hafnium oxide and zirconium oxide. Ferroelectric hafnium oxide may include any form of hafnium oxide that may exhibit ferroelectric properties. Ferroelectric zirconium oxide may include any form of zirconium oxide that may exhibit ferroelectric properties. This may include, for example, hafnium oxide, zirconium oxide, a solid solution of hafnium oxide and zirconium oxide (e.g., but not limited to it, a 1:1 mixture) or hafnium oxide and/or zirconium oxide doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide or zirconium oxide. The ferroelectric material may be doped at a concentration from about 2 mol % to about 6 mol %, only as an example. As another example, the material of a memory layer may be or may include scandium nitride.

According to various aspects, a memory cell (e.g., a memory cell 100, 200), may have at least two distinct states associated therewith, for example with two distinct electrical conductivities or two distinct amounts of stored charge that may be determined (e.g., measured) to determine in which of the at least two distinct states the memory cell is residing in. According to various aspects, a memory state the memory cell is residing may be a "programmed state" or an "erased state". As an example, the programmed state may be an electrically conducting state or a state with positive stored charge (e.g., associated with a logic "1") and the erased state may be an electrically non-conducting state or a state with negative stored charge (e.g., associated with a logic "0"). However, the definition of programmed state and erased state may be selected arbitrarily.

The remanent polarization of the spontaneous-polarizable memory layer may define the memory state a memory cell is residing in. According to various aspects, a memory cell may reside in a first memory state in the case that the spontaneous-polarizable memory layer is in a first polarization state, and the memory cell may reside in a second memory state in the case that the spontaneous-polarizable memory layer is in a second polarization state (e.g., opposite to the first polarization state).

The threshold voltage of a field-effect transistor structure (e.g., of the field-effect transistor structure 200*a*) may be a function of the amount and/or polarity of charge stored in the capacitive memory structure, e.g. on the polarization state of the spontaneous-polarizable memory layer. A first threshold voltage, e.g. a low threshold voltage $V_{L\text{-}th}$, may be associated with the first polarization state (e.g., with the first amount and/or polarity of stored charge), and a second threshold voltage, e.g. a high threshold voltage $V_{H\text{-}th}$, may be associated with the second polarization state (e.g., with the second amount and/or polarity of stored charge). Illustratively, the first memory state may be associated with the first threshold voltage (e.g., the first memory state may be referred to as LVT state), and the second memory state may be associated with the second threshold voltage (e.g., the second memory state may be referred to as HVT state).

According to various aspects, writing a memory cell or performing a write operation of a memory cell may include an operation or a process that modifies the memory state the memory cell is residing in from a (e.g., first) memory state to another (e.g., second) memory state. According to various aspects, writing a memory cell may include programming a memory cell (e.g., performing a programming operation of a memory cell), wherein the memory state the memory cell is residing in after programming may be called "programmed state". For example, programming an n-type FET based memory cell may modify the state the memory cell is residing in from the HVT state to the LVT state, whereas programming a p-type FET based memory cell may modify the state the memory cell is residing in from the LVT state to the HVT state. According to various aspects, writing a memory cell may include erasing a memory cell (e.g., performing an erasing operation of a memory cell), wherein the memory state the memory cell is residing in after the erasing may be called "erased state". For example, erasing an n-type FET based memory cell may modify the state the memory cell is residing in from the LVT state to the HVT state, whereas erasing a p-type FET based memory cell may modify the state the memory cell is residing in from the HVT state to the LVT state.

The readout of a memory cell including a field-effect transistor structure (e.g., the readout of the memory cell 200) may include a non-destructive readout. A readout voltage drop may be provided at the memory cell, and a readout current (e.g., a source-drain current, or any other type of readout current) output from the memory cell may be measured. The memory state the memory cell is residing in may be determined as a function of the measured readout current. In the case that the memory cell is residing in a conducting state (e.g., in the LVT state) a first (relatively higher) amount of current may be measured, and in the case that the memory cell is residing in a non-conducting state (e.g., in the HVT state) a second (relatively lower) amount of current may be measured. The memory state may be preserved by the readout (such that a further (re-)writing of the memory cell may be dispensed with).

Figure 3A:
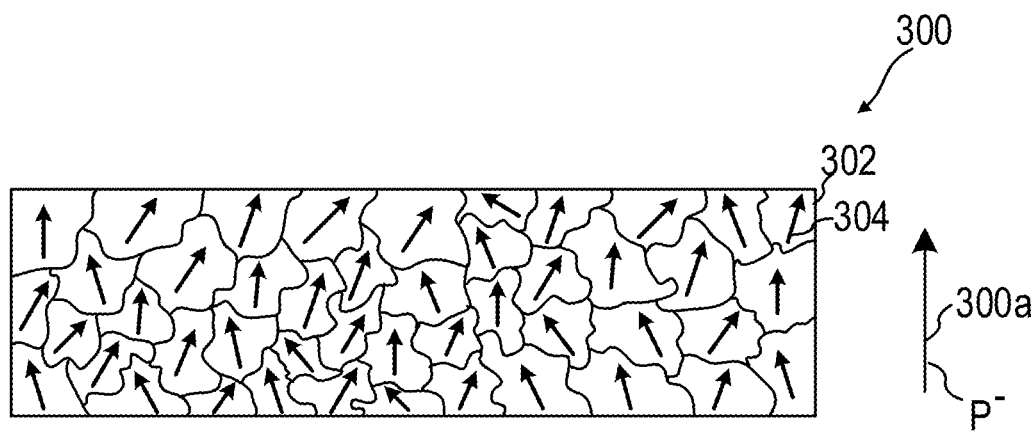
FIG. 3A to FIG. 3D each shows schematically a spontaneous-polarizable memory layer according to various aspects.
Figure 3B:
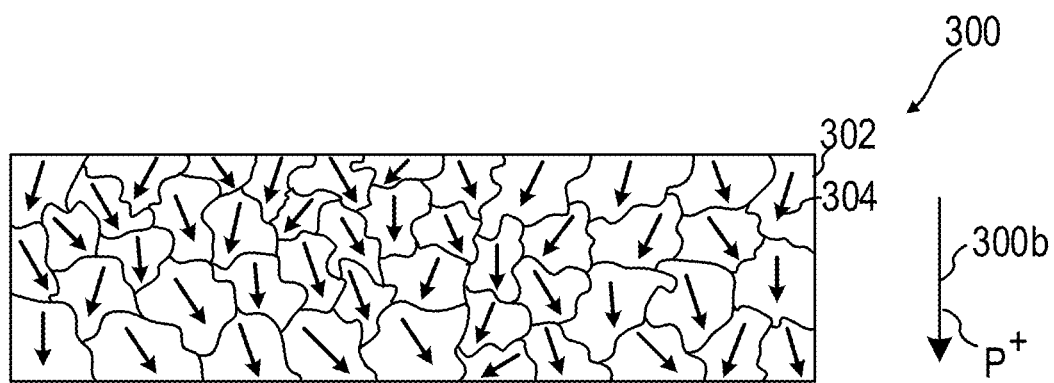

FIG. 3A and FIG. 3B show schematically a spontaneous-polarizable memory layer 300 in two exemplary polarization states. The spontaneous-polarizable memory layer 300 may be, for example, part of a memory element (e.g., part of the memory element 104), e.g. part of a capacitive memory structure and/or of a FeFET memory cell (e.g., of the capacitive memory structure 100 and/or the memory cell 200 described in relation to FIG. 1 and FIG. 2), as an example. The respective polarization state may be defined by a remanent polarization $P^+$, $P^-$ of the spontaneous-polarizable memory layer 300.

As an example (e.g., for an n-type doped substrate), in a first polarization state, the overall remanent polarization, $P^-$, within the spontaneous-polarizable memory layer 300 may be directed in a first direction 300a (see FIG. 3A). The first polarization state may be referred herein to as negative polarization state. In a second polarization state, the remanent polarization $P^+$ within the spontaneous-polarizable memory layer 300 may be directed in a second direction 300b (see FIG. 3B). The second polarization state may be referred herein to as positive polarization state. The second direction 300b may be opposite with respect to the first direction 300a.

The spontaneous-polarizable memory layer 300 (illustratively, the material of the spontaneous-polarizable memory layer 300) may include a plurality of grains 302 (e.g., may be formed by, or may consist of, a plurality of grains 302). The spontaneous-polarizable memory layer 300 may have a crystalline structure (e.g., a monoclinic structure, or a tetragonal structure, as examples), including the plurality of grains 302. Each grain 302 may have a respective polarization 304 (e.g., each grain 302 may be in a respective polarization state). For the sake of representation, only one grain 302 and the respective polarization 304 are labelled in FIG. 3A to FIG. 3D.

A grain 302 may be understood as a small crystal having a random crystallographic orientation. Upon formation of the spontaneous-polarizable memory layer 300 (e.g., upon deposition and crystallization), microscopic crystals (the grains 302) may grow, ultimately forming the structure of the spontaneous-polarizable memory layer 300. The areas between (adjacent) grains 302 are the so-called grain boundaries, which may be understood as the outside part of a grain 302 that provides separation from the other (neighboring) grains 302.

The overall (remanent) polarization of the spontaneous-polarizable memory layer 300 may be defined by the combination, e.g. the (vector) sum or the overlay, of the individual (remanent) polarizations 304 of the grains 302 forming the layer 300. Illustratively, the direction and the magnitude of the polarization ($P^+$, or $P^-$) of the spontaneous-polarizable memory layer 300 may be defined by the result of the combination of the individual polarizations 304 of the grains 302 (with the respective direction, and the respective magnitude). As an example, in FIG. 3A, the individual polarizations 304 may (overall) point towards the first direction 300a, in such a way that the overall polarization (also referred to herein as total polarization) of the spontaneous-polarizable memory layer 300 may be directed towards the first direction 300a (thus resulting in an overall negative polarization state). As another example, in FIG. 3B, the individual polarizations 304 point towards the second direction 300b, in such a way that the overall polarization of the spontaneous-polarizable memory layer 300 may be directed towards the second direction 300b (thus resulting in an overall positive polarization state).

The writing of a memory cell including the spontaneous-polarizable memory layer 300 may include flipping the overall polarization of the memory layer (from one direction to the other direction), e.g. flipping the individual polarizations 304 of the grains 302 forming the spontaneous-polarizable memory layer 300 towards the desired direction (e.g., towards the first or second direction 300a, 300b) to define the desired polarization state (and the associated memory state). As described in further detail below, a voltage drop may be provided at the memory cell (e.g., at the spontaneous-polarizable memory layer 300) to induce the desired modification of the polarization of the spontaneous-polarizable memory layer 300 (illustratively, the desired flipping of the individual polarizations 304 of the grains 302).

Figure 3C:
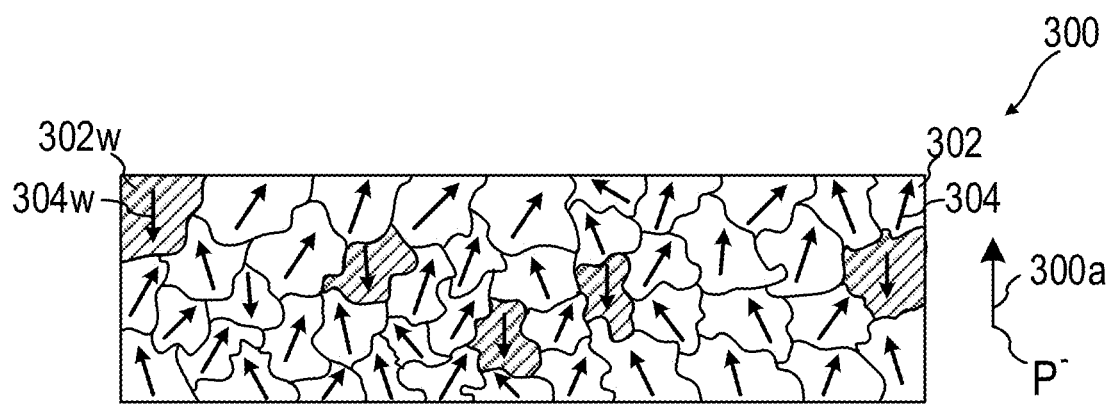
Figure 3D:
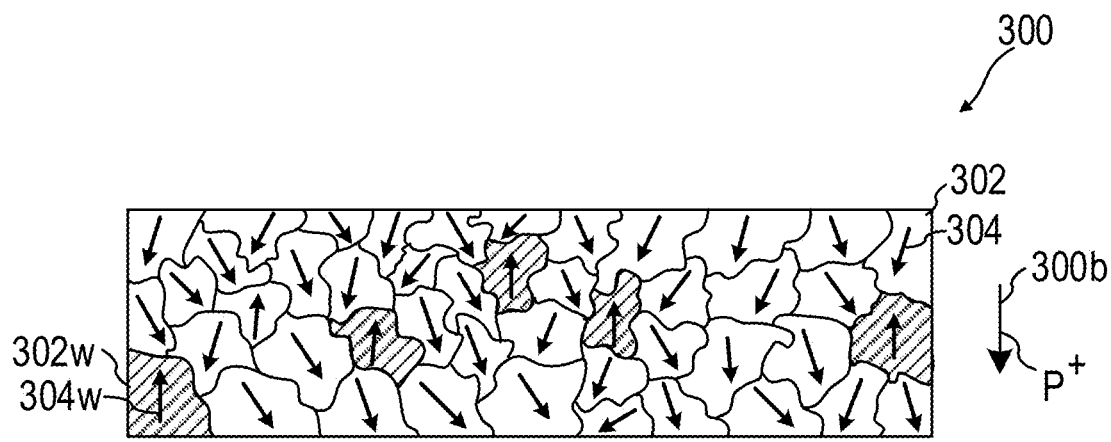

Various aspects may be based on the realization that not all the grains 302 forming a spontaneous-polarizable memory layer 300 may have a stable polarization 304 (e.g., not all the grains 302 may be in a stable polarization state). A stable operation (e.g., a stable data retention) of a memory cell including the spontaneous-polarizable memory layer 300 may be provided in the case that the grains 302 would not flip the respective polarization 304 in absence of the write voltage drop provided thereto (in other words, in absence of an operation aimed at intentionally flipping the polarization state). The stability would be ensured in the case that a grain 302 written to be in a certain polarization state would remain in that polarization state until the next writing operation. However, as shown in FIG. 3C and FIG. 3D, one or more of the grains 302w may be in an unstable polarization state, e.g. may be in a polarization state that may be (too) easily flipped (even without a write voltage drop being provided at the spontaneous-polarizable memory layer 300).

An unstable (or weak) polarization state may be understood as a polarization state susceptible to be modified, e.g. flipped, by an electric field less than a coercive field of the memory layer 300, e.g. by an electric field less that the electric field that would theoretically be required to flip the polarization state of the memory layer 300.

One or more of the grains 302w (illustrated with a stripe pattern in FIG. 3C and FIG. 3D) of the spontaneous-polarizable memory layer 300 may flip the respective polarization 304w over time (e.g., in the time between a writing operation and the subsequent writing operation), and may be in a polarization state opposite to the desired polarization state for the memory layer 300. The undesired flipping of the polarization may be due, for example, to a disturb caused by writing and reading operations carried out in neighboring memory cells in a memory cell arrangement. Illustratively, the supplying of write voltages and readout voltages to other memory cells of the memory cell arrangement may lead to the spontaneous-polarizable memory layer 300 experiencing a (relatively small) electric field (e.g., a relatively small voltage drop). Such small electric field may not be sufficient to flip the polarization 304 of the stable grains, but may lead over time to a flipping of the polarization 304w of the weakly polarized grains 302w. The polarization of the unstable grains 302w may alter its direction in an abrupt manner or in a gradual manner, e.g. over time with the contributions of all the disturbs originating from writing/ reading the other memory cells. Illustratively, the "disturb effects" of the writing and reading operation carried out on the other memory cells may sum over time, ultimately causing the flipping of the polarization 304w of the unstable grains 302w.

The presence of one or more grains 302w having a polarization 304w opposite to a desired polarization for the memory layer 300 may have a detrimental effect on the memory properties of the memory layer 300 (and of a memory cell including the layer). As an example, the overall polarization of the memory layer 300 may be reduced (e.g., the direction, illustratively the sign, may remain the same, but the magnitude may decrease over time), as a function of how many grains 302w have a flipped polarization 304w. The reduction of the overall polarization may cause failures when reading out the memory state the memory cell is residing in (e.g., a read out current may be less than an expected read out current, so that the memory state may not be unambiguously identified). As another example, in the case that a sufficient number of grains 302w (e.g., more than 50% of the grains 302) have a flipped polarization 304w, the overall polarization of the memory layer 300 may flip, so that the memory layer 300 stores a "wrong" memory state (illustratively, a memory state different from the intended memory state into which the memory layer 300 was written).

The detrimental effects of the undesired (and unnoticed) flipping of the polarization of the grains of a spontaneous-polarizable memory layer will be explained in further detail in relation to FIG. 4A to FIG. 5B.

Figure 4A:
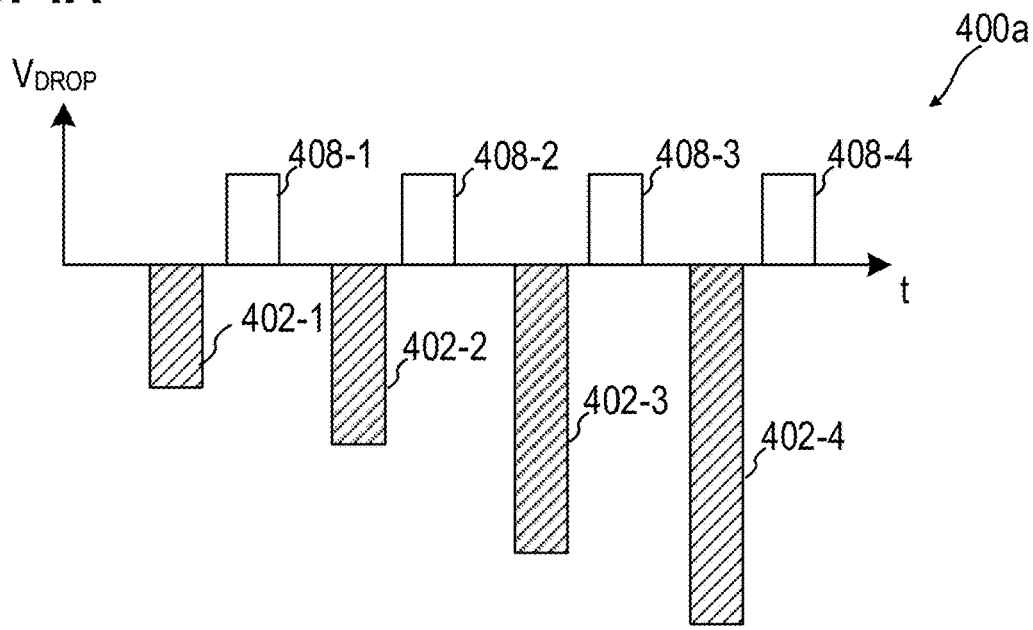
FIG. 4A to FIG. 4C show a writing operation according to various aspects.
Figure 4B:
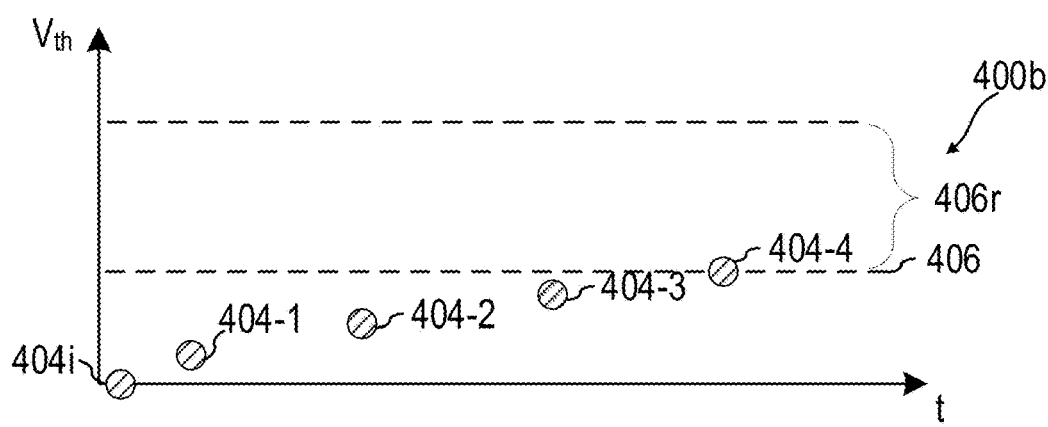
Figure 4C:
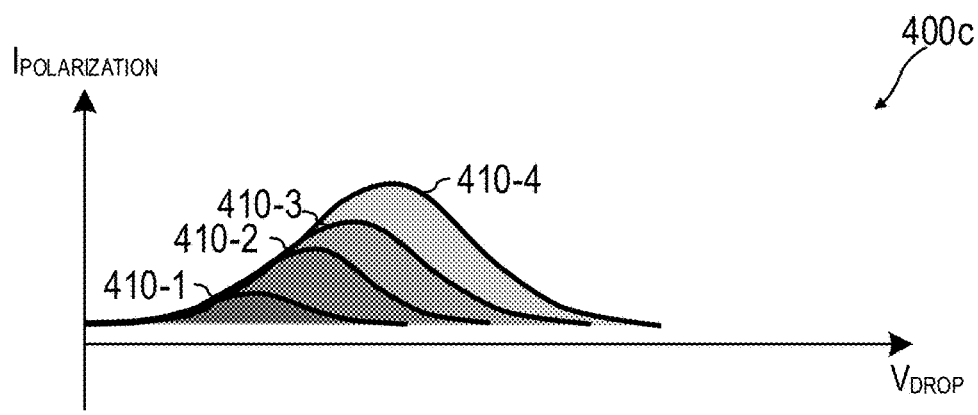

FIG. 4A, FIG. 4B, and FIG. 4C illustrate a writing operation, according to various aspects.

As illustrated in the graph 400a, in a (e.g., non-adapted) writing operation, a (first) write voltage drop 402-1 may be provided at a memory cell (e.g., a write voltage may be provided at a gate node, and a base voltage may be provided at a source node of a field-effect transistor based memory cell, as an example). After providing the (first) write voltage drop 402-1, it may be checked whether the memory cell resides in the desired memory state. In the exemplary configuration in FIG. 4A, the write voltage drop 402-1 may be an erase voltage drop to bring the memory cell in an erased state. It is however understood that similar considerations may apply in the case of a programming voltage drop to bring the memory cell in a programmed state.

The checking may include determining whether a (first) threshold voltage 404-1 associated with the memory cell (and with the first write voltage drop 402-1) has reached a predefined target threshold voltage value 406, e.g. whether the threshold voltage 404-1 is in a target threshold voltage range 406r, as shown in the graph 400b in FIG. 4B. Illustratively, the threshold voltage associated with the memory cell may have an initial value 404i, and may be modified (e.g., increased in the configuration in FIG. 4A to FIG. 4C) by the write voltage drop 402-1 provided at the memory cell. The checking may include, for example, reading out the memory state the memory cell is residing in, e.g. by providing a (first) readout voltage drop 408-1 at the memory cell, and evaluating the resulting signal, e.g. a (first) readout current 410-1 output by the memory cell (e.g., a (first) polarization current in case of a capacitive memory structure, as shown in FIG. 4C, or a source-drain current in case of a field-effect transistor based memory cell).

The writing and the checking of the memory cell may be repeated, e.g. with subsequent write voltage drops and readout voltage drops, until the memory cell reaches the desired memory state, e.g. may be repeated as long as the threshold voltage of the memory cell does not reach the target threshold voltage 406. In the exemplary scenario in FIG. 4A to FIG. 4C, the writing may be repeated with second to fourth write voltage drops 402-2, 402-3, 402-4 and readout voltage drops 408-2, 408-3, 408-4, until the threshold voltage 404-2, 404-3, 404-4 is into the target voltage range 406r (e.g., until the output current 410-2, 410-3, 410-4 reaches an expected readout current for the desired memory state). In the case that the memory cell is a capacitive memory structure, the writing may be repeated until a measured polarization current reaches and/or exceeds a target polarization current, as shown in FIG. 4C, or in the case that the memory cell includes a field-effect transistor structure the writing may be repeated until a measured source-drain current reaches and/or exceeds a target source-drain current.

In the writing operation shown in FIG. 4A to FIG. 4C, the success may be determined by the threshold voltage of the memory cell reaching the target threshold voltage value 406 (or the readout current reaching or exceeding the expected readout current). The writing operation may thus be terminated as soon as the target threshold voltage value 406 is reached. However, merely reaching the target threshold voltage value or range may not be sufficient to ensure a stable operation of the memory cell, due to the presence of weakly polarized grains in the memory layer of the memory cell. The threshold voltage may decrease over time, due to the disturb effects described above, and fall outside the target threshold voltage range 406r (e.g., fall below the target threshold voltage value 406 in the exemplary scenario in FIG. 4B), thus leading to a possible failure of a (future) readout.

Figure 5A:
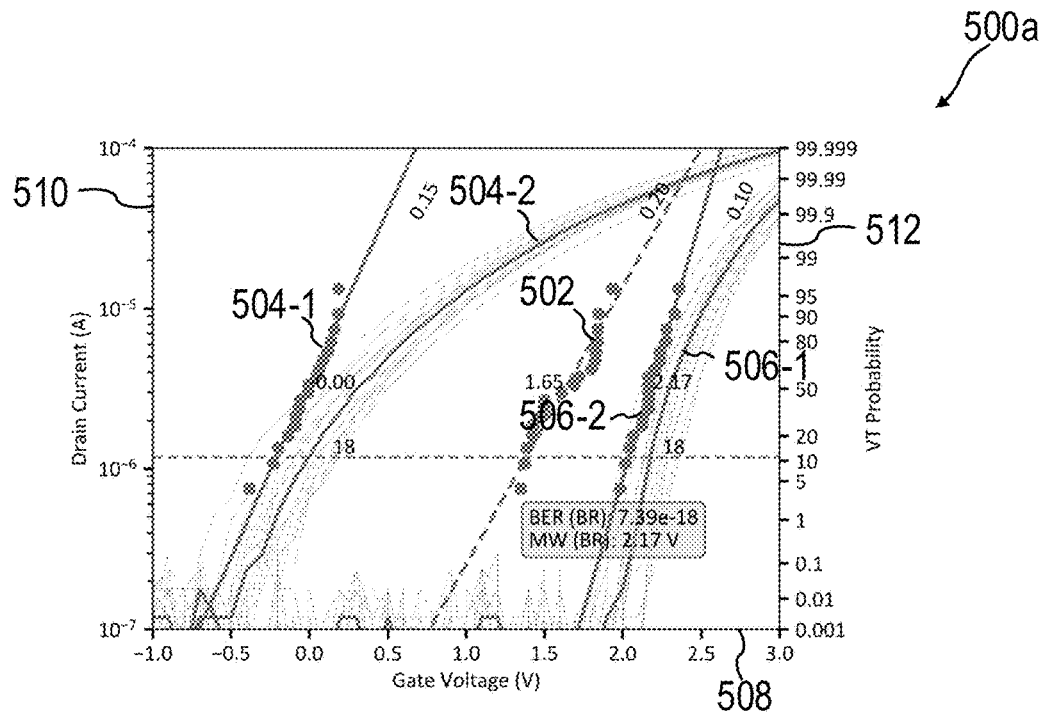
FIG. 5A and FIG. 5B each shows a graph related to switching time and disturb in a spontaneous-polarizable memory layer according to various aspects.
Figure 5B:
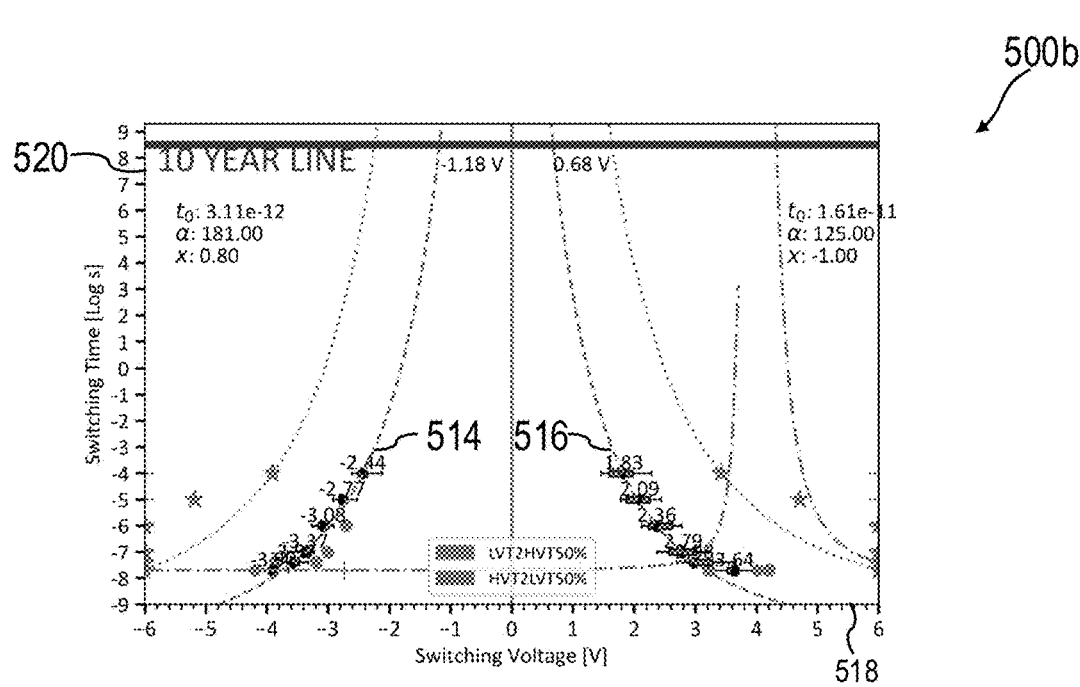

The effects of the disturb on a memory cell, e.g. on a spontaneous-polarizable memory layer, are further illustrated in FIG. 5A and FIG. 5B.

In the graph 500a in FIG. 5A a distribution of threshold voltages for a pristine memory layer 502, of a memory layer in the LVT state 504-1, 504-2, and of a memory layer in the HVT state 506-1, 506-2 is shown in terms of drain current (in A, along a first vertical axis 510, in a logarithmic scale) and cumulative probability density function of the threshold voltage (VT probability, along a second vertical axis 512) as a function of a voltage drop provided at the memory layer (e.g., expressed as gate voltage, in V, along the horizontal axis 508).

The curve 504-1 describes the distribution of threshold voltages for memory cells in the LVT state, and shows that a voltage drop of about 1.5 V provided at the memory cell (e.g., a gate voltage of about 1.5 V considering a source voltage of 0 V) is greater than the (low) threshold voltage for more than 99% of the (tested) memory cells. The curve 506-1 describes the distribution of threshold voltages for memory cells in the HVT state, and shows that a voltage drop of about 2.75 V provided at the memory cell is greater than the (high) threshold voltage for more than 99% of the (tested) memory cells.

The data points 504-2 describe the response, in terms of drain current, of a memory cell being in the LVT state to a voltage drop provided thereto, and show that the memory cell is in a conductive state (or in a state with relatively higher conductivity), in which upon providing a relatively small voltage drop, a detectable current flow may be allowed. The data points 506-2 describe the response, in terms of drain current, of a memory cell being in the HVT state to a voltage drop provided thereto, and show that the memory cell is in a non-conductive state (or in a state with relatively smaller conductivity), in which a detectable current flow may be prevented until a suitably high voltage drop is provided. As shown in the graph 500*a*, a memory cell may have a switching time in the range from 20 ns to 60 ns, e.g. a switching time of 40 ns.

The graph 500*b* in FIG. 5B shows the switching time (in Log(s), along the vertical axis 520) as a function of a switching voltage (in V, along the horizontal axis 518). The evaluation in graph 500*b* provides an estimate of the switching behavior of the memory cell(s) as a function of a time (switching time) for which a certain voltage (the switching voltage) is applied to a memory cell (a relevant time scale for memory related applications). The switching voltage-time plot 500*b* indicates a disturb time around 1 ms to 100 ms. The data points 514, 516 in the graph 500*b* illustratively describe for how long a certain voltage drop (e.g., defined by a certain switching voltage and a reference voltage) should be provided at a memory cell for switching about 50% of the grains of the memory layer into a desired polarization state (e.g., about 50% of the grains from a polarization defining a HVT state to a polarization defining a LVT state, shown by the data points 516, or about 50% of the grains from a polarization defining a LVT state to a polarization defining a HVT state, shown by the data points 514). The graph 500*b* shows that a relatively low voltage provided for a relatively long time may provide a similar switching behavior as a relatively high voltage provided for a relatively short time. From the graph 500*b* it may be understood that the effects of relatively low voltages provided at a memory cell that cumulate over time may have an overall (cumulated) effect similar to that of a greater voltage. It may thus be understood that a (disturb) voltage drop at a memory cell, even a small one, may lead to an undesired switching of the polarization state of the grains (and ultimately of the memory cell) over time. The flipping of the polarization of the grains of the spontaneous-polarizable memory layer described in relation to FIG. 3A to FIG. 3D leads over time to the polarization state of the memory cell becoming more and more unstable, thus resulting in a reduction of the voltage to be provided for switching the memory state the memory cell is residing in.

Various aspects are related to an adapted writing operation designed to counter act the disturb-related effects that cause a reduction of the polarization over time. The adapted writing operation will be described in further detail in relation to FIG. 7A to FIG. 7D, in the context of a memory cell arrangement (shown in FIG. 6). It is however understood that the adapted writing operation may be provided at the "single cell level", e.g. may be provided for the operation of an individual memory cell, without requiring the presence of additional memory cells.

FIG. 6 illustrates schematically an exemplary configuration of a memory cell arrangement 600, according to various aspects. The memory cell arrangement 600 may include one or more memory cells 602. The memory cells 602 may be arranged, for example, in a matrix architecture. The memory cells 602 may be arranged in a number, n, of columns and in a number, m, of rows, with m and n integer numbers equal to or greater than 1. FIG. 6 illustrates two columns (e.g., a first column and a second column) and two rows (e.g., a first row and a second row) of a memory cell arrangement 600 including two memory cells 602 each, only as an example. The memory cell arrangement 600 may include any suitable number of memory cells 602, arranged in any suitable number, n, of columns and in any suitable number, m, of rows. The one or more memory cells 602 (e.g., at least one, or each, of the memory cells 602) may be configured as the capacitive memory structure 100 and/or as the memory cell 200 described in relation to FIG. 1 and FIG. 2.

According to various aspects, each memory cell 602 of the one or more memory cells 602 may include one or more control nodes. As an example, each memory cell 602 may include at least a second control node 604*s*, a third control node 604*d*, and a first control node 604*w* to control an electrical behavior of the second control node 604*s* and the third control node 604*d* of the memory cell 602 (e.g., a current flow between the second control node 604*s* and the third control node 604*d*).

According to various aspects, at least one (e.g., each) memory cell 602 of the one or more memory cells 602 may be a field-effect transistor (FET) based memory cell, e.g. may include a field-effect transistor structure, and may include two source/drain regions and a gate region (also referred to as gate structure) to control a current flow between the two source/drain region. As an example, a memory cell 602 may include a gate node 604*w*, a source node 604*s*, and a drain node 604*d*. The gate node 604*w* may be coupled to the gate region of the memory cell 602. The source node 604*s* may be coupled to the source region of the memory cell 602. The drain node 604*d* may be coupled to the drain region of the memory cell 602.

According to various aspects, the memory cell arrangement 600 may include a plurality of control-lines (e.g., one or more word-lines, WL, one or more bit-lines, BL, and one or more source-lines, SL), coupled to the memory cells 602. The control-lines may be used to supply voltages to control nodes of the memory cells 602. The plurality of control-lines may be arranged in any suitable way defined by the desired matrix architecture of the memory cell arrangement 600. As an example, the first control node 604*w* of each memory cell 602 may be connected to a corresponding word-line, WL, the second control node 604*s* of each memory cell 602 may be connected to a corresponding source-line, SL, and the third control node 604*d* of each memory cell 602 may be connected to a corresponding bit-line, BL. Each source-line, SL, may be coupled to each memory cell 602 in a same column of memory cells 602. Each bit-line, BL, may be coupled to each memory cell 602 in a same column of memory cells 602. Each word-line, WL, may be coupled to each memory cell 602 in a same row of memory cells 602.

According to various aspects, at least one (e.g., each) memory cell 602 may include an additional (e.g., a fourth) control node. In this case, the memory cell(s) 602 may be assigned to an additional (e.g., fourth) control line, for example to an additional word-line, WL. A four terminal memory cell (also referred to as four node memory cell or four terminal device) may be, for example, a ternary memory cell (e.g., a Ternary Content Addressable Memory (TCAM) cell).

It is understood that, in various aspects, the one or more memory cells 602 (e.g., at least one, or each memory cell 602) may include only a capacitive memory structure without a field-effect transistor structure, as described above. In this configuration, the control nodes of a memory cell 602 may be coupled with the one or more electrodes of the capacitive memory structure. In case the one or more memory cells 602 are capacitive memory structures, each memory cell 602 may include a control node for each of the respective one or more electrodes (e.g., two control nodes in the case that the memory cell includes two electrodes, as shown in the configuration in FIG. 1). The memory cell arrangement 600 may have, in this configuration, a crossbar arrangement (e.g., may be a crossbar array), in which each electrode of a capacitive memory structure may be connected to a respective control-line (e.g., two control-lines for each memory cell, in the case that the capacitive memory structure includes a first electrode and a second electrode), see also the inset 730 in FIG. 7E.

In a memory cell arrangement (e.g., in the memory cell arrangement 600), the addressing of a memory cell may have an influence also on the other memory cells, as described above. Illustratively, the voltages provided to the control lines associated with a memory cell may lead to other memory cells (not intended to be addressed) also experiencing an electric field (e.g., a voltage drop at the respective memory element, e.g. over the respective spontaneous-polarizable memory layer). The addressing of a memory cell may thus "disturb" the other memory cells (e.g., may create a disturb on "passive" word-lines), and lead over time to an undesired depolarization of their spontaneous-polarizable memory layer, e.g. as described in relation to FIG. 3A to FIG. 5B.

In various aspects, the memory cell arrangement 600 may be configured to carry out an adapted writing operation, in which a memory cell is written in a way that makes it robust, e.g. against the influence of the addressing of other memory cells 602. In the following, as an exemplary case, the adapted writing of one individual memory cell 602w, e.g. the memory cell 602 in position (2,2), is described. It is understood that more than one or all memory cells 602, for example in a same row of memory cells 602, may be written at the same time (e.g., by means of a common adapted write operation).

According to various aspects, the memory cell arrangement 600 may include a control circuit 610 configured to carry out and/or instruct one or more writing operations (a writing operation may also be referred to herein as write operation) associated with a writing of the memory cells 602 of the memory cell arrangement 600. The control circuit 610 may be configured to cause a writing of a memory cell 602w of the memory cell arrangement 600 by an adapted writing operation, which will be described in further detail in relation to FIG. 7A to FIG. 7D. In brief, the control circuit 610 may be configured to supply a write signal set 610w and a post-conditioning signal set 610p to the memory cells 602 (illustratively, to the memory cell(s) 602w intended to be written and/or post-conditioned). As an example, the control circuit 610 may include or may control one or more voltage supply circuits. The one or more voltage supply circuits may be used for supplying control voltages (e.g., write voltages, readout voltages, and post-conditioning voltages) to the control-lines of the memory cell arrangement 600, e.g. for supplying voltages to the respective control nodes of the one or more memory cells 602. According to various aspects, the control circuit 610 may define a base voltage, $V_B$, e.g. a ground voltage (for example 0 V) associated with the memory cell arrangement 600 (the base voltage, $V_B$, may also be referred to herein as reference voltage, $V_{ref}$).

FIG. 7A, FIG. 7B, FIG. 7C, FIG. 7D, and FIG. 7E illustrate an adapted writing operation according to various aspects. The adapted writing operation shown in FIG. 7A to FIG. 7E may be carried out by a control circuit of a memory cell arrangement, e.g. by the control circuit 610 of the memory cell arrangement 600. The adapted writing is described in FIG. 7A and FIG. 7B with reference to an erasing of a memory cell (e.g., providing a voltage drop with a negative polarity, e.g. in the case that of an n-type memory cell), and in FIG. 7C and FIG. 7D with reference to a programming of the memory cell.

The adapted writing operation may include carrying out a writing sequence until a memory cell intended to be written (e.g., the memory cell 602w) resides in a robust memory state, e.g. resides in a desired memory state and is in a stable polarization state. The adapted writing operation may include a controlled depolarization of the memory cell intended to be written to determine whether the reached memory state is sufficiently stable (and will remain sufficiently stable over time).

The writing sequence may include supplying a write signal set (e.g., the write signal set 610w) to the memory cell intended to be written, e.g. to the memory cell 602w. The write signal set may include one or more write signals configured to provide a write voltage drop at the at least one memory cell. As shown in the graph 700a, 700c in FIG. 7A and FIG. 7C in a first repetition of the writing sequence 720-1, the one or more (first) write signals of the write signal set may be configured to provide a (first) voltage drop 702-1 at the memory cell intended to be written (e.g., a negative voltage drop or a positive voltage drop, depending on the intended operation).

A voltage drop (e.g., a write voltage drop, a readout voltage drop, or a post-conditioning voltage drop, described below) provided at a memory cell (e.g., at the memory cell 602w) may be understood as a difference between two voltages/potentials provided (directly or indirectly) at the memory cell, e.g. a difference between a voltage provided at the respective control nodes (e.g., at the respective source node 602s and the respective gate node 602w, as an example). In various aspects, a voltage drop may be provided by one or more voltage pulses provided at the memory cell, e.g., one or more voltage pulses provided at one node, and one or more other voltage pulses provided at another node, or one or more voltage pulses provided at one node and a base voltage provided at another node. A voltage drop being configured to carry out a certain function may be understood as the respective voltages/potentials defining the voltage drop as being selected to carry out that function.

The write voltage drop may be configured to bring the memory cell in a desired memory state by polarizing the spontaneous-polarizable memory layer of the memory cell. Illustratively, the write voltage drop may be configured to provide an electric field at the memory cell, e.g. over the spontaneous-polarizable memory layer, greater than a coercive field associated with the memory cell. In some aspects, e.g. in case the memory cell includes a FET structure, the write voltage drop may be configured to bring a threshold voltage associated with the at least one memory cell into a target threshold voltage range 705r by polarizing the spontaneous-polarizable memory layer of the memory cell. The write voltage drop may be configured to influence the polarization of the spontaneous-polarizable memory layer of the memory cell such that the threshold voltage associated with the memory cell goes from an initial value 704i to a (first) value 704-1 associated with the (first) write voltage drop. The write voltage drop may be configured to flip a memory state the memory cell was residing in before the supplying of the write signal set. The threshold voltage may increase from the initial value 704i to the first value 704-1 (as shown in the graph 700b in FIG. 7B), or may decrease from the initial value 704i to the first value 704-1 (as shown in the graph 700d in FIG. 7D) depending on the intended operation (and on the sign of the threshold voltage).

Figure 7A:
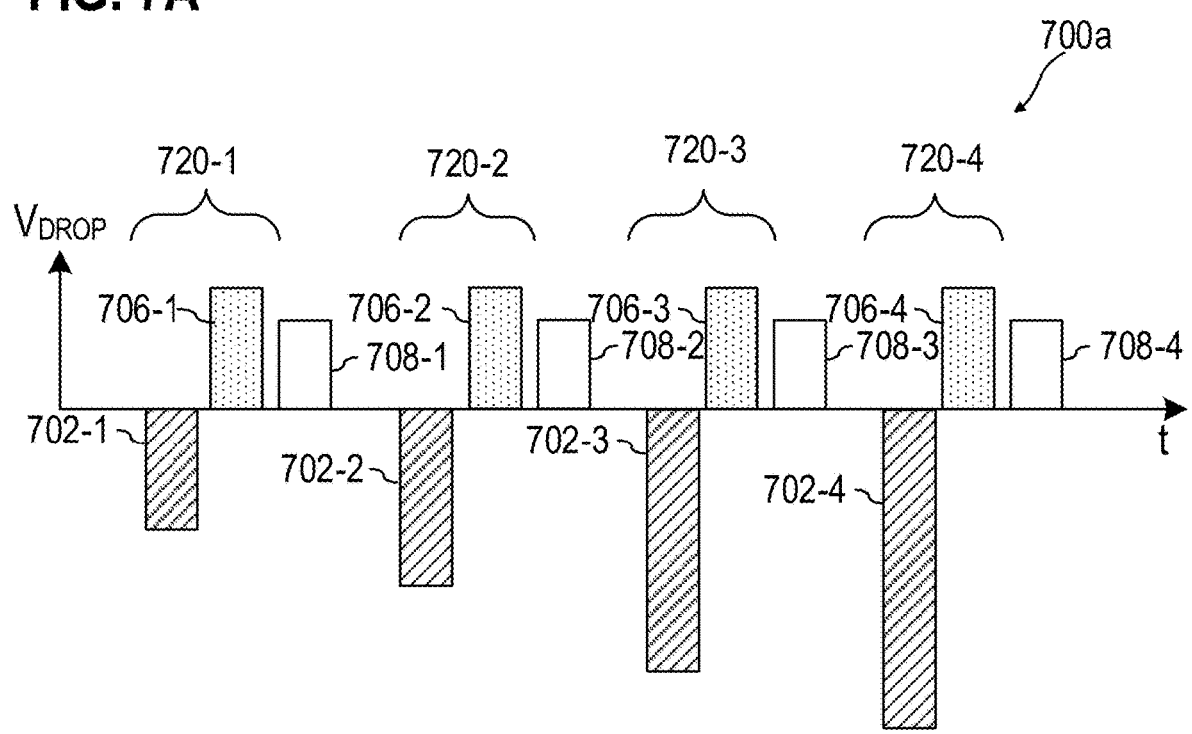
FIG. 7A to FIG. 7E show an adapted writing operation according to various aspects.
Figure 7B:
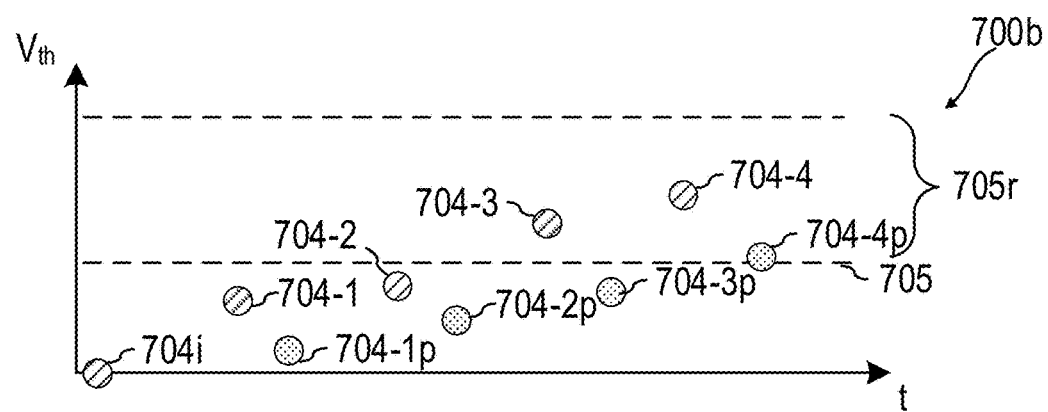
Figure 7C:
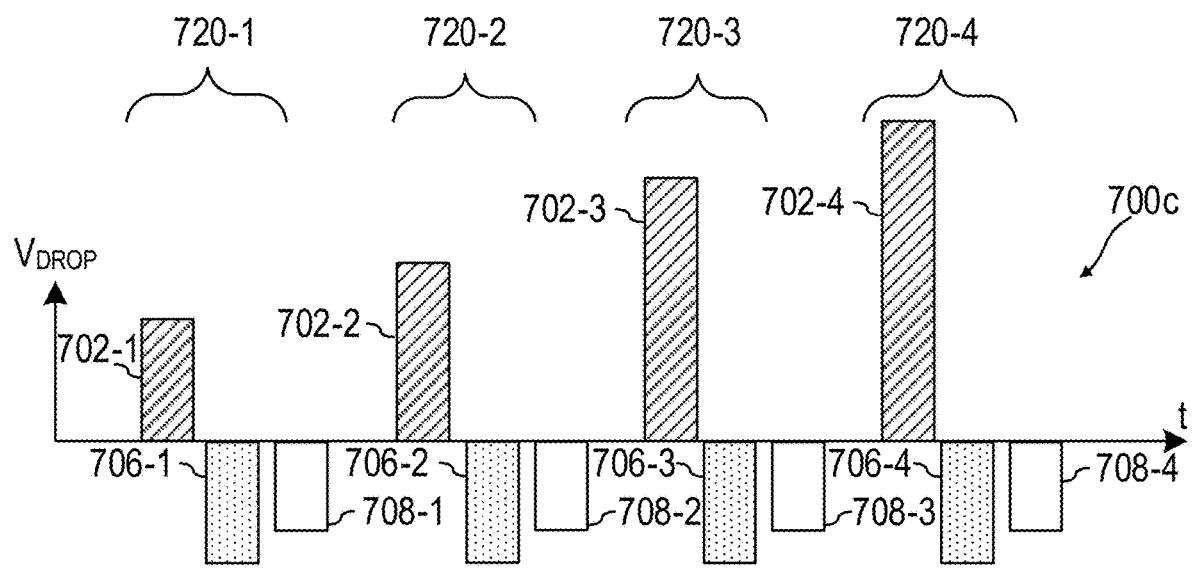
Figure 7D:
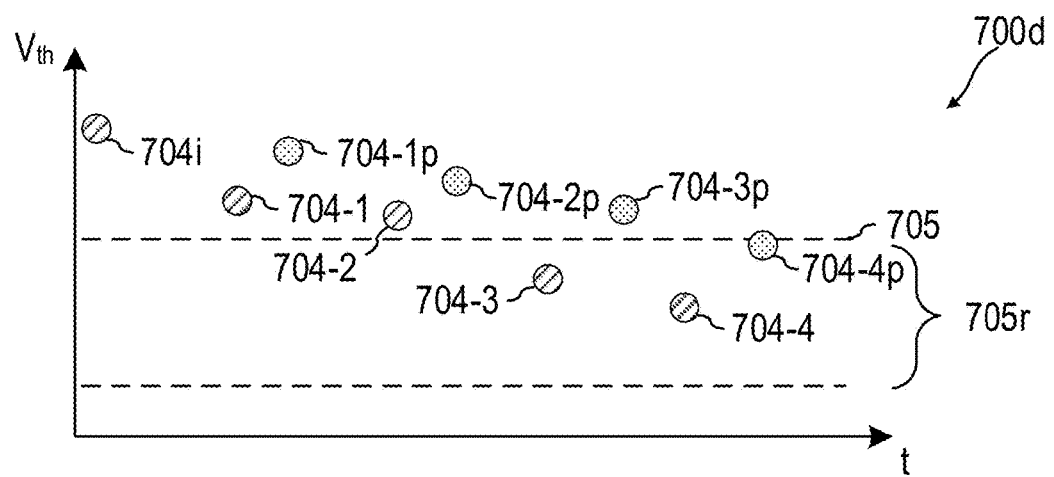

In the graphs 700b, 700d in FIG. 7B and FIG. 7D the target threshold voltage value 705 (and the target threshold voltage range 705r, e.g. defined by the target threshold voltage value 705 at one end, and by another predefined threshold voltage at the other end) may have a positive value or a negative value, depending on the configuration of the memory cell (e.g., n-type or p-type) and/or on the intended operation (e.g., erasing or programming).

In the graphs 700*b*, 700*d* in FIG. 7B and FIG. 7D the target threshold voltage value 705 may be reached with a further repetition of the writing sequence, e.g. with the third repetition 720-3 including a third write voltage drop 702-3. In various aspects, in the case that it is determined that the memory cell does not reside in the desired memory state, as described below, the write signal set (e.g., the one or more write signals) may be adapted to provide a greater write voltage drop for bringing the memory cell in the desired memory state.

As a difference with respect to a non-adapted writing operation (see for example FIG. 4A to FIG. 4C), the adapted writing is not interrupted as soon as the threshold voltage of the memory cell is in the target threshold voltage range 705*r* (or as soon as the threshold voltage has reached a target value 705). The writing sequence, on the contrary, includes an intentional attempt at depolarizing the memory cell, e.g. an intentional attempt at flipping the polarization of the weak grains of the memory layer, to verify whether the memory cell has reached a stable memory state.

The writing sequence may include, after supplying the write signal set, supplying a post-conditioning signal set (e.g., the post-conditioning signal set 610*p*) to the memory cell(s) intended to be written. The post-conditioning signal set may also be referred to herein as "(intentional) disturb signal set", or "depolarization signal set". The post-conditioning signal set may include one or more post-conditioning signals configured to provide a (first) post-conditioning voltage drop 706-1 over the memory cell(s) intended to be written. A post-conditioning voltage drop (e.g., the first post-conditioning voltage drop 706-1, and the subsequent post-conditioning voltage drops, if present) may be configured to induce a partial depolarization of the spontaneous-polarizable memory layer of the memory cell(s). Illustratively, the post-conditioning voltage drop may be configured to induce a flipping of the polarization of the weakly polarized grains of the memory layer. The post-conditioning voltage drop may be configured to reduce the remanent polarization of the spontaneous-polarizable memory layer (by inducing such flipping of the polarization state of the unstable grains). As a result, in the case that the memory cell includes a field-effect transistor, the post-conditioning voltage drop may be configured to modify (in other words, to change) the threshold voltage associated with the memory cell intended to be written, e.g. by inducing the partial depolarization (and reducing the remanent polarization). In various aspects, the (first) post-conditioning voltage drop 706-1 may have opposite polarity with respect to the (first) write voltage drop 704-1, e.g. to partially depolarize the memory layer. The write voltage drop may have a first polarity, and the post-conditioning voltage drop may have a second polarity, opposite the first polarity.

In various aspects, a post-conditioning write voltage drop provided at a memory cell may be configured to decrease (illustratively, to reduce, or to narrow) a size (in terms of a voltage difference between an LVT and an HVT state of the memory cell) of a memory window associated with that memory cell. A memory window associated with a memory cell may be defined by the respective first (e.g., low) threshold voltage and the respective second (e.g., high) threshold voltage. The memory window may be or may include a distance (in other words, a difference) between the first threshold voltage and the second threshold voltage. Illustratively, a memory window may define a range of readout voltage drops (e.g., a range of gate source voltages, $V_{GS}$) which may be provided to the memory cell to determine its memory state.

According to various aspects, a memory cell may be regarded as being in the LVT state in the case that more than 50% of the grains forming the memory layer have a polarization state that defines a LVT state for that type of memory cell (e.g., a positive polarization for a n-type FET, or a negative polarization for a p-type FET, as examples). A memory cell may be regarded as being in the HVT state in the case that more than 50% of the grains forming the memory layer have a polarization state that defines a HVT state for that type of memory cell (e.g., a negative polarization for a n-type FET, or a positive polarization for a p-type FET, as examples).

The (first) post-conditioning voltage drop 706-1 may increase or decrease the threshold voltage associated with the memory cell. The change of the threshold voltage caused by the post-conditioning voltage drop may be understood, for example, as an increase of a voltage difference between an absolute value of the threshold voltage and an absolute value of a target threshold voltage value 705. Illustratively, the change of the threshold voltage may include a decrease of an absolute value of the threshold voltage, which may include a decrease of a positive threshold voltage value (e.g., in case the target threshold voltage value is a positive value, for example a decrease from 2 V to 1.5 V, e.g. for an erase operation), or an increase of a negative threshold voltage value (e.g., in case the target threshold voltage value is a negative value, for example an increase from −2 V to −1.5 V, e.g. for a programming operation).

In the case that the memory cell is a n-type FET based memory cell, and the writing operation is for bringing the memory cell from the HVT state (the high-threshold voltage state) to the LVT state (the low-threshold voltage state), the post-conditioning voltage drop may be configured to induce a positive shift of the threshold voltage, e.g. may be configured to increase the threshold voltage. Illustratively, the positive shift of the threshold voltage may include a shift of the threshold voltage towards greater values or more positive values (e.g., from −2 V to −1.5 V, as an example). In the case that the writing operation is for bringing the memory cell from the LVT state to the HVT state, the post-conditioning voltage drop may be configured to induce a negative shift of the threshold voltage, e.g. may be configured to decrease the threshold voltage. Illustratively, the negative shift of the threshold voltage may include a shift of the threshold voltage towards smaller values or more negative values (e.g., from 2 V to 1.5 V, as an example).

In the case that the memory cell is a p-type FET based memory cell, and the writing operation is for bringing the memory cell from the HVT state (the high threshold voltage state) to the LVT state (the low threshold voltage state), the post-conditioning voltage drop may be configured to induce a negative shift of the threshold voltage, e.g. may be configured to decrease the threshold voltage. In the case that the writing operation is for bringing the memory cell from the LVT state to the HVT state, the post-conditioning voltage drop may be configured to induce a positive shift of the threshold voltage, e.g. may be configured to increase the threshold voltage.

By way of illustration, the post-conditioning voltage drop may be configured to induce a shift of the threshold voltage in an opposite direction with respect to a shift of the threshold voltage induced by the write voltage drop provided at the memory cell. The shift of the threshold voltage induced by the post-conditioning voltage drop may be in a direction such that a size (e.g., a width) of the memory window associated with the memory cell is decreased. The increase or decrease of the threshold voltage value may provide the narrowing of the memory window associated with the memory cell. Illustratively, one of the at least two threshold voltages may be shifted by the post-conditioning voltage drop in a direction (illustratively, considering a IV-plot associated with the memory cell) that brings the threshold voltage closer to the other one of the at least two threshold voltages.

The post-conditioning voltage drop may be configured to switch back the grains that would be susceptible to disturb (during data storage). The post-conditioning voltage drop may provide determining whether the memory cell would have been able to maintain the desired memory state over time, despite external disturbs. Illustratively, the post-conditioning voltage drop may provide getting rid of the unstable grains immediately during writing, so that the memory state of the memory cell is provided by grains having a stable polarization.

The post-conditioning voltage drop may be configured to reduce a magnitude of the remanent polarization of the spontaneous-polarizable memory layer without causing an inversion of a sign of the remanent polarization of the spontaneous-polarizable memory layer. Illustratively, the post-conditioning voltage drop may be configured in such a way that it does not write the memory cell, e.g. it does not switch a memory state the memory cell is (or should be) residing in. The post-conditioning voltage drop may be configured not to flip a memory state the memory cell was residing in, in other words may be configured to maintain a memory state the memory cell is residing in.

The writing scheme may include checking, after carrying out the writing sequence (e.g., after providing the (first) writing voltage drop and post-conditioning voltage drop at the memory cell), whether the memory cell (still) resides in the desired memory state. Illustratively, the writing scheme may include checking whether the post-conditioning voltage drop flipped too many grains (e.g., whether the memory cell included too many unstable grains to begin with), in such a way that the memory state of the memory cell can no longer be unambiguously distinguished (e.g., in such a way that the memory window has become too narrow). As an example, the writing scheme may include checking, after carrying out the writing sequence, whether a readout current output from the memory cell is in a target current range (e.g., whether a polarization current has a target current value, or whether the source/drain current has a target current value, depending on the architecture of the memory cell). In some aspects, the writing scheme may include checking, after carrying out the writing sequence, whether the threshold voltage associated with the memory cell is in the target threshold voltage range 705r.

Checking whether the memory cell resides in the (desired) memory state, e.g. checking whether the polarization current or source/drain current is in the target current range and/or whether the threshold voltage associated with the memory cell is in the target threshold voltage range, may include supplying a readout signal set to the memory cell. The readout signal set may include on or more readout signals configured to provide a (first) readout voltage drop 708-1 at the memory cell. The readout voltage drop may allow a current flow in the memory cell, which may be measured to determine the memory state the memory cell is residing in, as described in relation to the capacitive memory structure 100 in FIG. 1 and to the memory cell 200 in FIG. 2. Illustratively, checking whether the memory cell is in the memory state may include a readout of the memory state of the memory cell, e.g. it may include determining a readout current output by the memory cell (e.g., a polarization current or a source/drain current, depending on the type of memory cell), as shown in the graphs in FIG. 7E. The graphs in FIG. 7E may illustrate the case in which the memory cell is a capacitive memory structure (with a related polarization current, e.g. a related displacement current), but it is understood that they may apply in a similar manner in the case in which the memory cell includes a field-effect transistor structure (with a related source/drain current). The value of the readout current output by the memory cell may be compared with a target value (e.g., a reference current value or a reference voltage value). Depending on the result of the comparison it may be determined whether the memory cell resides in the memory state. The target value may be, for example, a current value that should be output by the memory cell in the case that it was residing in the memory state. As an example, in the case that the value of the readout current output by the memory cell substantially corresponds to the target value it may be determined that the memory cell resides in the memory state. As another example, it may be determined that the memory cell resides in the memory state in the case that the value of the readout current output by the memory cell is below the target value (e.g., in the case that the target memory state is or should be a non-conducting state) or above the target value (e.g., in the case that the target memory state is or should be a conducting state).

Figure 7E:
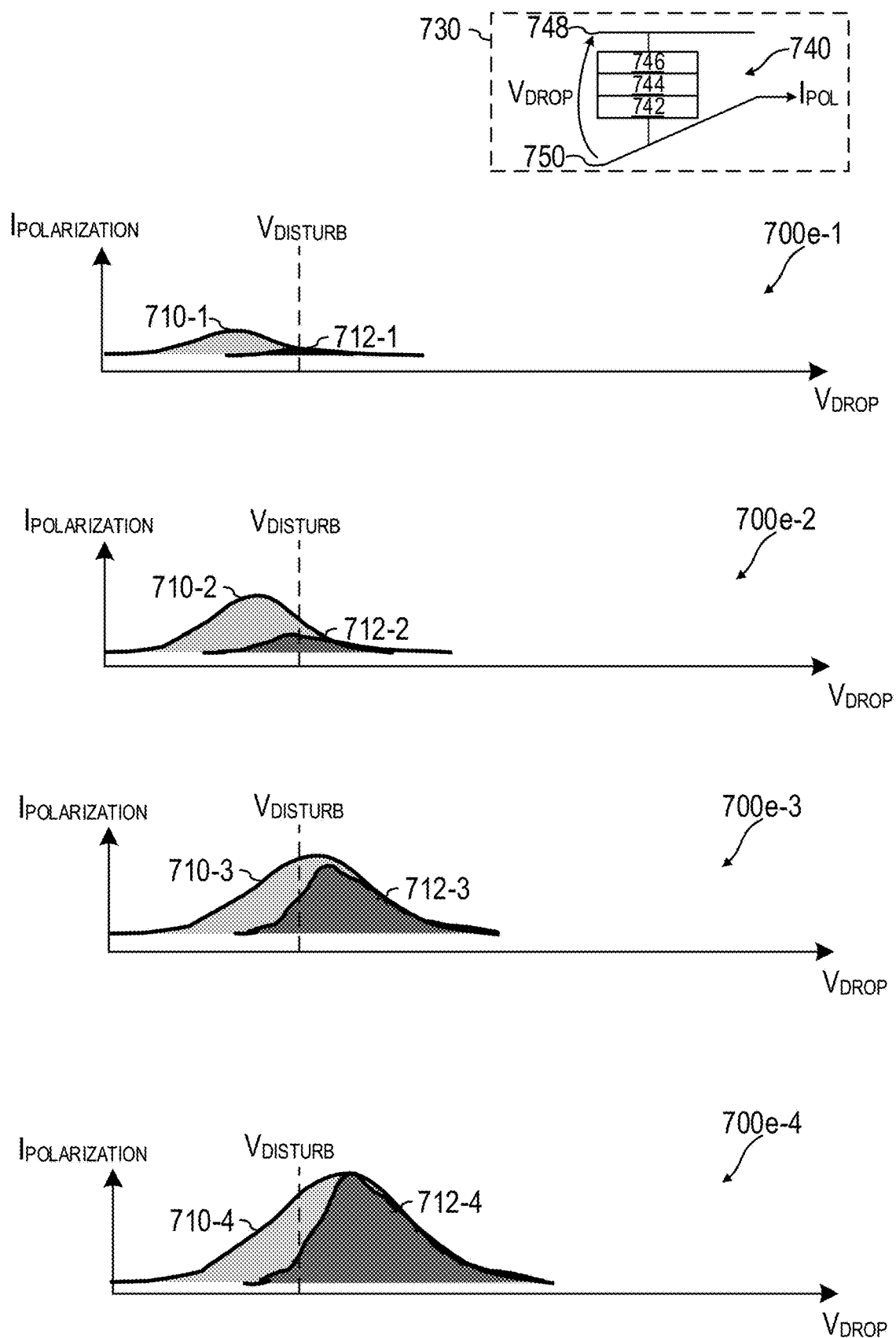

In FIG. 7E, the inset 730 illustrates in a schematic view a readout of a capacitive memory structure 740 (e.g., configured as the capacitive memory structure 100) according to various aspects. The capacitive memory structure 740 may be configured as the capacitive memory structure 100, e.g. may include a first electrode 742, a second electrode 746, and a memory layer 744 (e.g., a spontaneous-polarizable memory layer) disposed between the first electrode 742 and the second electrode 746. The electrodes 742, 746 of the capacitive memory structure 740 may be coupled to a respective control line 748, 750 (e.g., of a memory cell arrangement). A readout voltage drop, $V_{DROP}$, may be provided at the capacitive memory structure 740 via the control lines 748, 750. In the inset 730 a readout voltage drop having a positive polarity is shown, but it is understood that the aspects described herein may apply also to a readout voltage drop having a negative polarity. A polarization current $I_{POL}$ (shown in the graphs as $I_{POLARIZATION}$) may be output from the capacitive memory structure 740 upon providing the readout voltage drop, $V_{DROP}$. The polarization current $I_{POL}$ may be measured at one of the control lines 748, 750 corresponding to the capacitive memory structure 740.

In various aspects, checking whether the threshold voltage associated with the memory cell is in the target threshold voltage range 705r may include determining whether an absolute value of the threshold voltage associated with the memory cell is equal to or greater than an absolute value of a target threshold voltage value 705 (e.g., may include checking whether the threshold voltage is above or below the target threshold voltage value 705, depending on the intended operation).

In the case that the memory cell resides in the desired memory state, e.g. in the case that the checking determines that the (reduced) threshold voltage associated with the memory cell is in the target threshold voltage range 705r, the writing operation may be ended. The writing operation may be concluded in the case that the flipping of the unstable grains did not cause a deterioration of the memory state such that it can no longer be unambiguously distinguished. In some aspects, the writing operation may be ended after the checking, e.g. in case the read out of the memory state in a non-destructive read out (as described in relation to the memory cell 200 in FIG. 2). In some aspects, the writing operation may be ended after the checking even in case of a destructive read out, e.g. in case the memory cell still resides in the desired memory state.

In some aspects, in the case that the memory cell resides in the desired memory state (e.g., in the case that the checking determines that the threshold voltage associated with the memory cell is in the target threshold voltage range), the writing operation may further include repeating at least a part of the writing sequence, e.g. repeating at least the supplying of the write voltage set to the memory cell. In case the readout of the memory state is a destructive readout (as described in relation to the capacitive memory structure 100 in FIG. 1), the memory cell may be (re-)written in the desired memory state. The same write voltage set that provided the robust memory state may be used again for re-writing the memory cell (e.g., a write voltage set configured to provide a write voltage drop having a same (or greater) magnitude as the write voltage drop of the previous repetition of the writing sequence). The writing operation may be ended after such re-writing of the memory cell.

In the case that the memory cell does not reside in the desired memory state after a repetition of the writing sequence (e.g., after the initial, or first, repetition 720-1), e.g. in the case that the readout current is not in the desired range and/or in the case that the (reduced) threshold voltage 704-1p associated with the memory cell is not in the target threshold voltage range 705r (as it is the case in the exemplary scenario in FIG. 7A to FIG. 7E), the writing sequence may be repeated (illustratively, a plurality of writing sequences may be provided). The write signal set may be supplied (again) to the memory cell, followed by the post-conditioning signal set. In the exemplary scenario in FIG. 7A to FIG. 7D second to fourth repetitions of the writing sequence 720-2, 720-3, 720-4 are illustrated. It is understood that the writing operation may include any suitable number of repetitions of the writing sequence, e.g. one (in the case that the memory cell immediately reaches a stable state), two, three, four, five, or more than five, until a stable state is achieved. In various aspects, a maximum number of repetitions may be provided (e.g., 10, or 20, as numerical examples), and in the case that the memory cell does not reach a stable state within the maximum number of repetitions may be labelled as "defective", as an example. The writing scheme, e.g. all the repetitions of the writing sequence, may be related to a single program operation or a single erase operation for the memory cell(s) intended to be written. Illustratively, supplying the write signal set(s) and post-conditioning signal set(s) until a stable state is reached (e.g., until the threshold voltage is within the target range) may form an individual operation for writing a memory cell. The (overall) writing operation may be configured to bring the memory cell into a memory state of at least two memory states, the at least two memory states including a first memory state (e.g., the LVT state) associated with a first threshold voltage and a second memory state (e.g., the HVT state) associated with a second threshold voltage, as described above.

As shown in FIG. 7A to FIG. 7D, a further (e.g., second) repetition of the writing sequence may include the write signal set (e.g., the one or more write signals) being configured to provide a further (e.g., second) write voltage drop 702-2 at the memory cell to write the memory cell in the desired memory state (e.g., to bring the threshold voltage 704-2 in the target range 705r). In various aspects, the further (e.g., second) write voltage drop 702-2 may be different from the write voltage drop 702-1 of the previous repetition, e.g. may have a same (first) polarity and a greater magnitude, as shown in FIG. 7A and FIG. 7C, as described in further detail below. The write voltage drops in subsequent repetitions may be configured to provide a more stable polarization of the memory layer of the memory cell, e.g. by inducing a stronger polarization in the grains of the memory layer.

In various aspects, a further (e.g., second) write voltage drop 702-2 may be equal to the write voltage drop 702-1 of the previous repetition, e.g. may have a same (first) polarity and a same magnitude. Even in the case that a same write voltage drop is used in a subsequent repetition, the polarization of the memory layer of the memory cell may be more stable in view of the fact that the memory cell has already been (pre)polarized in the previous repetition. The previous write voltage drop may have already flipped the polarization state of some (or all) the grains of the memory layer, and the post-conditioning voltage drop may have flipped back only the polarization state of the weak grains. The memory layer of the memory cell may thus be already (pre-)polarized (illustratively, it may already include grain with the desired polarization) when the further write voltage drop is provided at the memory cell, so that a more stable (a more strongly polarized) state may be reached, even without changing one or more properties of the write voltage drop (e.g., of the write signals).

A further (e.g., second) repetition of the writing sequence may include the one or more post-conditioning signals of the post-conditioning signal set being configured to provide a further (e.g., second) post-conditioning voltage drop 706-2 at the memory cell to partially depolarize the memory layer (and reduce the threshold voltage 704-2p). In various aspects, the further post-conditioning voltage drops may be the same as the post-conditioning voltage drops in the previous repetition(s) of the writing sequence, e.g. may have a same (second) polarity and a same magnitude.

In the exemplary configuration in FIG. 7A to FIG. 7D, the memory cell after the second repetition of the writing sequence 720-2 may still be in an unstable memory state, e.g., the threshold voltage 704-2p after the second post-conditioning voltage drop 706-2 may be outside the target range 705r. The writing operation may continue with further repetitions of the writing sequence, e.g. a third repetition 720-3 (with a third write voltage drop 702-3, a third post-conditioning voltage drop 706-3, a third readout voltage drop 708-3, providing a third threshold voltage 704-3, 704-3p), and a fourth repetition 720-4 (with a fourth write voltage drop 702-4, a fourth post-conditioning voltage drop 706-4, a fourth readout voltage drop 708-4, providing a fourth threshold voltage 704-4, 704-4p), as an example. In the exemplary scenario in FIG. 7A to FIG. 7D, the memory cell may reside in a stable memory state after the fourth repetition 720-4 of the writing sequence, e.g. the threshold voltage 704-4p may be in the target threshold voltage range 705r. As shown in FIG. 7E, the readout after the first repetition 720-1 of the writing sequence, shown in graph 700e-1, the readout after the second repetition 720-2, shown in graph 700e-2, and the readout after the third repetition 720-3, shown in graph 700e-3 provide a readout current 710-1, 710-2, 710-3 (e.g., a polarization current in FIG. 7E, or a source/drain current) after the supplying of the respective write voltage drop and a readout current 712-1, 712-2, 712-3 after the supplying of the respective post-conditioning voltage drop being less than a target current. The readout after the fourth repetition 720-4 of the writing sequence, shown in graph 700e-4, provides a readout current 710-4 after the supplying of the fourth write voltage drop 702-4 and a readout current 712-4 after the supplying of the fourth post-conditioning voltage drop 706-4 being equal to or greater than a target current (e.g., a readout current being in a target current range).

It is understood that the scenario in FIG. 7A to FIG. 7E is only an example, and the sequence would have been further repeated in the case that the memory state was not stable, e.g. with a fifth (and further) write voltage drop and a fifth (and further post-conditioning voltage drop), e.g. with a fifth voltage drop having greater magnitude. The repetitions of the writing sequence may ensure that enough grains with sufficiently high switching voltage are programmed only.

In the adapted writing operation, there may be no checking (e.g., no readout) after supplying a write signal set (e.g., after providing a write voltage drop) at the memory cell(s) intended to be written, since the memory cell being in the desired memory state after supplying the write signal set is not sufficient to determine whether a robust state has been reached.

As described above, the write voltage drop in subsequent repetitions of the write sequence may have a greater magnitude (a greater amplitude) than a write voltage drop in the initial repetition (e.g., greater than a write voltage drop in each of the preceding repetitions), and the post-conditioning voltage drop in subsequent repetitions may have a same magnitude as in the initial repetition (e.g., as in each of the preceding repetitions). A possible implementation will be described in further detail below. In other aspects, the write voltage drop in subsequent repetitions of the write sequence may have a same magnitude as the write voltage drop in the initial repetition, and the post-conditioning voltage drop in subsequent repetitions may have a same magnitude as in the initial repetition, and the stable memory state may be reached by repeating the write sequence without altering the properties of the write signal set and/or of the post-conditioning signal set.

In various aspects, the one or more write signals may include one or more write voltage pulses (e.g., one or more first write voltage pulses in an initial repetition, one or more second write voltage pulses in a subsequent repetition, one or more third write voltage pulses in a further subsequent repetition, etc.). One or more properties of the write voltage pulses may be adapted to provide different write voltage drops in different repetitions (or may be maintained unaltered to provide a same write voltage drop in different repetitions). The one or more post-conditioning signals may include one or more post-conditioning voltage pulses (e.g., one or more first post-conditioning voltage pulses in an initial repetition, one or more second post-conditioning voltage pulses in a subsequent repetition, one or more third post-conditioning voltage pulses in a further subsequent repetition, etc.). One or more properties of the post-conditioning voltage pulses may be maintained unaltered to provide same post-conditioning voltage drops in different repetitions.

One or more voltage pulses (e.g., one or more write voltage pulses or one or more post-conditioning voltage pulses) may include a number of voltage pulses. Only as a numerical example, the number of voltage pulses of one or more (e.g., write or post-conditioning) voltage pulses may be in the range from 1 to 10000, e.g. in the range from 1 to 1000, e.g. in the range from 1 to 100.

A voltage pulse (e.g., a write voltage pulse and/or a post-conditioning voltage pulse) may have an amplitude (also referred to as pulse height for a pulsed voltage). The amplitude may be or may represent a maximum voltage value (or voltage level) associated with the voltage pulse. In other words, the amplitude may be or may represent the magnitude of a voltage level (e.g., a write voltage or a post-conditioning voltage) associated with the voltage pulse. Illustratively, the amplitude may be or may represent a voltage level associated with the voltage pulse evaluated with respect to a reference voltage, $V_{ref}$, e.g. a base voltage, $V_B$, e.g. of a memory cell arrangement. The amplitude may also be referred to as peak amplitude. Only as a numerical example, the pulse height of a (e.g., write or post-conditioning) voltage pulse may be in the range from about 1 V to about 10 V, e.g. from about 2 V to about 5 V, e.g. 4 V.

In some aspects, each voltage pulse of one or more voltage pulses may have the same pulse height. In some other aspects, a voltage pulse of one or more voltage pulses may have a pulse height not necessarily equal to the pulse height of the other voltage pulses of the one or more voltage pulses (in the case of a plurality of voltage pulses), e.g. a voltage pulse of the one or more voltage pulses may have a pulse height different from the pulse height of at least another one of the one or more voltage pulses.

According to various aspects, a voltage pulse (e.g., a write voltage pulse and/or a post-conditioning voltage pulse) may have a pulse width (also referred to as pulse length or duration). The pulse width may be, in some aspects, determined as so called full width at half maximum (FWHM) of a pulse. In various aspects, one or more voltage pulses may have a total on-time, e.g. a total time in which the one or more pulses may have a non-zero amplitude. In some aspects, a total on-time of (or associated with) one or more voltage pulses may be understood as a sum of the (individual) pulse widths of the one or more pulses. A total on-time may coincide with a pulse width of the one or more voltage pulses in the case that the one or more voltage pulses include a single pulse. Only as a numerical example, the (individual) pulse width of a (e.g., write or post-conditioning) voltage pulse may be in the range from about 1 ns to about 100 ns, e.g. in the range from about 5 ns to about 20 ns, e.g. about 10 ns. Only as a numerical example, a total on-time of one or more (e.g., write or post-conditioning) voltage pulse may be in the range from about 1 ns to about 100 ms, e.g. in the range from about 10 ns to about 10 ms.

In some aspects, each voltage pulse of one or more voltage pulses may have the same pulse width. In some other aspects, a voltage pulse of one or more voltage pulses may have a pulse width not necessarily equal to the pulse width of other voltage pulses of the one or more voltage pulses (in the case of a plurality of voltage pulses), e.g. a voltage pulse of the one or more voltage pulses may have a pulse width different from the pulse width of at least another one of the one or more voltage pulses.

The total on-time of one or more voltage pulses may be different (e.g., greater or smaller) from the total on-time of one or more other voltage pulses, for example, in the case that the number of pulses is the same but the one or more voltage pulses have different (e.g., greater or smaller) pulse width with respect to the one or more other voltage pulses. As another example, the total on-time of one or more voltage pulses may be different from the total on-time of one or more other voltage pulses in the case that the pulse widths are equal but the number of pulses of the one or more voltage pulses is different (e.g., greater or smaller) with respect to the number of pulses of the one or more other voltage pulses. As a further example, the total on-time of one or more voltage pulses may be different from the total on-time of one or more other voltage pulses in the case that both the pulse width(s) and the number of pulses of the one or more voltage pulses are different from the pulse width(s) and the number of pulses of the one or more other voltage pulses.

According to various aspects, a voltage pulse (e.g., a write voltage pulse and/or a post-conditioning voltage pulse) may have a polarity, e.g. a positive polarity or a negative polarity. The polarity of a voltage pulse may be understood as a sign of the amplitude of the voltage pulse, e.g. with respect to the reference voltage, $V_{ref}$. The polarity of a voltage pulse may be selected depending on the intended operation (e.g., on the memory state to be written) and/or depending on the type of memory cell (e.g., on the type of field-effect transistor structure). The polarity of a voltage pulse may be selected, in some aspects, to provide a desired polarity of a voltage drop across a memory layer of the memory cell, e.g. a desired polarity of a gate-source voltage drop $V_{GS}$.

In some aspects, providing a voltage pulse at a memory cell may be understood as providing a corresponding voltage drop across the memory layer of the memory cell (e.g., in the case that the voltage pulse is provided at the gate node of the memory cell and the reference voltage, $V_{ref}$, is provided at the source node of the memory cell). As an example, a voltage drop having a positive polarity may be provided by providing a positive voltage pulse at the gate node and the reference voltage, $V_{ref}$, at the source node, or by providing a negative voltage pulse at the source node and the reference voltage, $V_{ref}$, at the gate node. As another example, a voltage drop having a negative polarity may be provided by providing a negative voltage pulse at the gate node and the reference voltage, $V_{ref}$, at the source node, or by providing a positive voltage pulse at the source node and the reference voltage, $V_{ref}$, at the gate node.

According to various aspects, a voltage pulse (e.g., a write voltage pulse and/or a post-conditioning voltage pulse) may have a rise time. The rise time may be or may represent the amount of time the voltage pulse takes to go from the reference voltage, $V_{ref}$, to the desired (e.g., write or post-conditioning) voltage, e.g. to the desired amplitude. As a numerical example, the rise time of a voltage pulse (e.g., of a write voltage pulse and/or of a post-conditioning voltage pulse) may be in the range from about 1 ns to about 100 ns, for example from about 5 ns to about 50 ns. According to various aspects, a voltage pulse (e.g., a write voltage pulse and/or a post-conditioning voltage pulse) may have a fall time. The fall time may be or may represent the amount of time the voltage pulse takes to go from its (e.g., write or post-conditioning) voltage level to the reference voltage, $V_{ref}$. As a numerical example, the fall time of a voltage pulse (e.g., of a write voltage pulse and/or of a post-conditioning voltage pulse) may be in the range from about 1 ns to about 100 ns, for example from about 5 ns to about 50 ns.

In various aspects, the writing operation may include providing one or more write voltage pulses and one or more post-conditioning voltage pulses until the memory cell to be written is in the (target and stable) memory state.

In various aspects, one or more properties of the one or more write voltage pulses may be iteratively modified (e.g., at least one of, a pulse height, a pulse width, a total on-time, and/or a number of pulses may be iteratively increased) until the target memory state is reached (e.g., until a threshold voltage associated with the memory cell reaches a target value, e.g. until a current output by the memory cell reaches a target value). In some aspects, more than one property may be modified at the same time, e.g. two or more (e.g., all) of a pulse height, a pulse width, a total on-time, and/or a number of pulses may be iteratively increased.

As an example the pulse height of one or more write voltage pulses may be iteratively increased, for example up to a threshold pulse height (e.g., 5 V or 10 V), which may be defined in some aspects by the properties of the memory cell (e.g., by a coercive field of a spontaneous-polarizable memory layer of the memory cell). As another example, the pulse width (and/or the total on-time) of one or more write voltage pulses may be iteratively increased, for example up to a threshold pulse width and/or a threshold total on-time (e.g., 100 ns or 500 ns for an individual pulse width, e.g. 10 ms, 50 ms, or 100 ms for a total on-time). The threshold for the pulse width and/or for the total on-time may be defined by a maximum allowable duration for a write operation. As a further example, the number of pulses of one or more write voltage pulses may be iteratively increased, for example up to a threshold number of pulses (e.g., 1000 pulses or 10000 pulses). The threshold number of pulses may be defined by the maximum allowable duration for a write operation, e.g. taking into consideration the pulse width and the total on-time.

By way of illustration, in the case that a memory cell is to be written (e.g., programmed or erased), a (small) write voltage drop is provided at the memory cell. Direct after this write voltage drop, a post-conditioning voltage drop with an opposite polarity (and much smaller than a coercive voltage) may be provided at the memory cell. In the case that the threshold voltage reaches a target threshold voltage, no further voltage drops (e.g., no further pulses) will be applied to the memory cell. Otherwise, the operation may continue with longer write voltage pulses or larger write voltage pulses.

As an example, during an initial (e.g., first) repetition of the writing sequence, the one or more write signals may include one or more first write voltage pulses. The one or more first voltage pulses may have a first pulse height, a first on-time, a first number of pulses, and a first pulse width. The one or more first write voltage pulses may include a single write voltage pulse or a plurality (e.g., a sequence) of voltage pulses.

During a subsequent (e.g., second) repetition of the writing sequence, the one or more write signals may include one or more second write voltage pulses. The one or more second voltage pulses may have a second pulse height, a second on-time, a second number of pulses, and a second pulse width. The one or more second write voltage pulses may include a single write voltage pulse or a plurality (e.g., a sequence) of voltage pulses.

The one or more (second) write voltage pulses of a subsequent (e.g., second) repetition may differ from the one or more (first) write voltage pulses of a previous (e.g., initial, e.g. first) repetition with respect to at least one (e.g., with respect to one or more, e.g. with respect to all) of the properties of the write voltage pulses.

As an example, a pulse height of the one or more (first) write voltage pulses of a preceding (e.g., initial) repetition may be different from a pulse height of the one or more (second) write voltage pulses of a subsequent repetition, e.g. the pulse height of the one or more second write voltage pulses may be greater than the pulse height of the one or more first write voltage pulses.

As a further example, additionally or alternatively, a pulse width of the one or more (first) write voltage pulses of a preceding (e.g., initial) repetition may be different from a pulse width of the one or more (second) write voltage pulses of a subsequent repetition, e.g. the pulse width of the one or more second write voltage pulses may be greater than the pulse width of the one or more first write voltage pulses.

As a further example, additionally or alternatively, a total on-time of the one or more (first) write voltage pulses of a preceding (e.g., initial) repetition may be different from a total on-time of the one or more (second) write voltage pulses of a subsequent repetition, e.g. the total on-time of the one or more second write voltage pulses may be greater than the total on-time of the one or more first write voltage pulses.

As a further example, additionally or alternatively, a number of the one or more (first) write voltage pulses of a preceding (e.g., initial) repetition may be different from a number of the one or more (second) write voltage pulses of a subsequent repetition, e.g. the number of the one or more second write voltage pulses may be greater than the number of the one or more first write voltage pulses.

In a further repetition (if required), the one or more properties of the write voltage pulses may be further adapted, e.g. one or more third write voltage pulses may have a pulse width greater than the pulse width of the second write voltage pulses, and/or a pulse height greater than the pulse height of the second write voltage pulses, and/or a total on-time greater than the total on-time of the second write voltage pulses, and/or a number of pulses greater than the number of pulses of the second write voltage pulses, etc. The same may apply to one or more fourth write voltage pulses with respect to the one or more third write voltage pulses, etc.

In various aspects, the one or more properties of the write voltage pulses may be maintained unaltered in different repetitions of the write voltage sequence. Write voltage pulses having a same pulse height, a same pulse width, a same total on-time, and a same number of pulses may be provided in subsequent repetitions of the write voltage sequence, exploiting the pre-polarization of the memory layer of the memory cell(s) intended to be written provided by the previous repetition(s). Illustratively, the first write voltage pulses may have a pulse width equal to the pulse width of the second write voltage pulses, and a pulse height equal to the pulse height of the second write voltage pulses, and a total on-time equal to the total on-time of the second write voltage pulses, and a number of pulses equal to the number of pulses of the second write voltage pulses, etc.

In various aspects, the post-conditioning voltage drop provided in different repetitions of the writing sequence may remain substantially constant. The one or more post-conditioning signals in an initial (e.g., first) repetition may be configured to provide a same post-conditioning voltage drop as the one or more post-conditioning signals in a subsequent (e.g., second, third, fourth, etc.) repetition.

As an exemplary implementation, the one or more post-conditioning signals may include one or more post-conditioning voltage pulses (e.g., one or more first post-conditioning voltage pulses in an initial repetition, one or more second post-conditioning voltage pulses in a subsequent repetition, one or more third post-conditioning voltage pulses in a further subsequent repetition, etc.). The one or more post-conditioning voltage pulses in different repetitions may be equal to one another in one or more properties, e.g. in at least one of a pulse height, a pulse width, a total on-time, and/or a number of pulses. Illustratively, a pulse height of one or more (first) post-conditioning voltage pulses in a preceding (e.g., initial, e.g. first) repetition may be equal to a pulse height of one or more second (and/or third, fourth, etc.) post-conditioning voltage pulses in a subsequent repetition. Additionally or alternatively, a pulse width of one or more first post-conditioning voltage pulses may be equal to a pulse width of one or more second (and/or third, fourth, etc.) post-conditioning voltage pulses. Additionally or alternatively, a total on-time of one or more (first) post-conditioning voltage pulses in a preceding (e.g., initial) repetition may be equal to a total on-time of one or more second (and/or third, fourth, etc.) post-conditioning voltage pulses in a subsequent repetition. Additionally or alternatively, a number of one or more (first) post-conditioning voltage pulses in a preceding (e.g., initial) repetition may be equal to a number of one or more second (and/or third, fourth, etc.) post-conditioning voltage pulses in a subsequent repetition.

Figure 8:
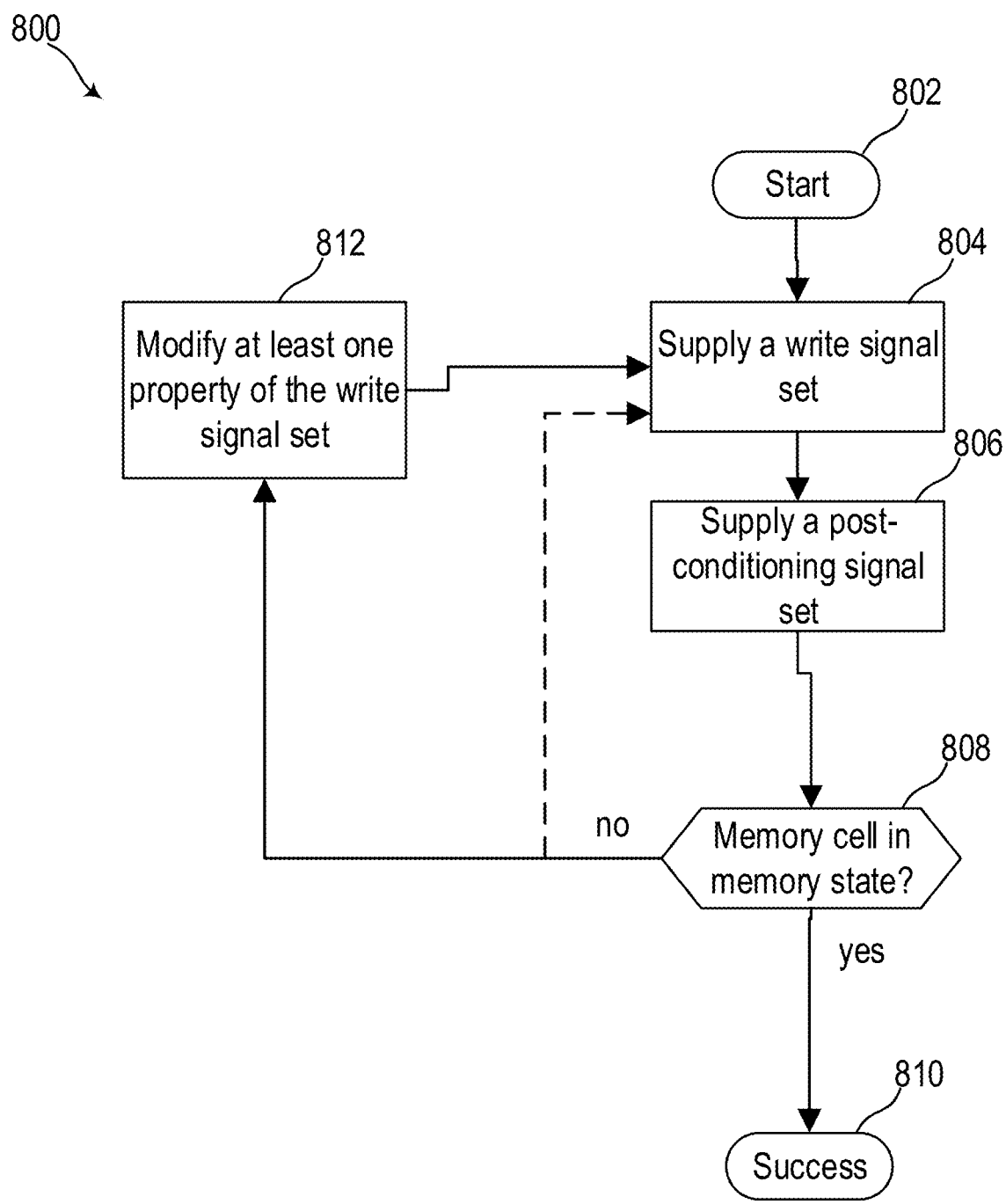
FIG. 8 shows a schematic flow diagram of an adapted writing operation according to various aspects.

FIG. 8 illustrates a schematic flow diagram of a method 800 for writing a memory cell (e.g., the memory cell 602w), e.g. a method for operating a memory cell arrangement (e.g., the memory cell arrangement 600), representing the post-conditioning scheme described herein. In some aspects, the method 800 may be understood as an algorithm for writing a memory cell. In some aspects, the method 800 may be understood as a method of determining a write voltage drop to be provided at a memory cell to write a robust memory state. The method 800, e.g. the write operation, may start in 802, e.g. a memory cell to be written may be selected (e.g., the memory cell 602w). The method 800 may be carried out by one or more processors (e.g., by the control circuit 610). The method 800 may be encoded in a computer program, e.g. instructions representing the algorithm steps may be encoded in a computer program.

In 804, the method 800 may include supplying a write signal set at the memory cell, e.g. including one or more write signals configured to provide a (first) write voltage drop at the memory cell to bring the memory cell in a desired memory state (e.g., to bring a threshold voltage associated with the at least one memory cell into a target threshold voltage range) by polarizing a spontaneous-polarizable memory layer of the memory cell. Illustratively, the method may include bringing a memory cell into a memory state of at least two memory states by applying a write signal set to the memory cell.

In 806, the method 800 may include supplying a post-conditioning signal set to the memory cell, e.g. including one or more post-conditioning signals configured to provide a post-conditioning voltage drop at the memory cell. The post-conditioning voltage drop may have opposite polarity with respect to the write voltage drop to partially depolarize the spontaneous-polarizable memory layer of the memory cell, e.g. to change (e.g., to increase or decrease) the threshold voltage associated with the at least one memory cell by partially depolarizing the spontaneous-polarizable memory layer. Illustratively, the method 800 may include verifying a robustness of the memory state by applying a set of disturb signal set to the memory cell after the memory cell is brought into the memory state Supplying the write signal set 804 and the post-conditioning signal set 806 may be understood as carrying out a writing sequence (e.g., a first repetition of the writing sequence).

In 808, the method 800 may include, after carrying out the writing sequence, checking whether the memory cell (still) resides in the desired memory state, e.g. checking whether the threshold voltage associated with the memory cell is in the target threshold voltage range.

If yes, (yes in 808), the writing operation may be ended with a success in 810. It may be determined that the memory cell resides in a stable memory state. The method 800 may include ending the writing of the memory cell in the case that the robustness of the memory state is verified.

In some aspects, if yes (yes in 808), e.g. in case of a destructive read out, the memory cell may be further written, e.g. at least the write voltage set may be supplied again to the memory cell (e.g., using the parameters of the write voltage pulses that provided the robust memory state, or write voltage pulses configured to provide an even greater write voltage drop).

If no, (no in 808), the method 800 may include repeating the writing sequence. The method 800 may illustratively include applying a further write signal set to the memory cell to bring the memory cell into a more robust memory state. In the case that it is determined that the memory cell does not (e.g., no longer) reside in the desired memory state, e.g. the threshold voltage is not in the target threshold voltage range, the writing sequence may be repeated. The method 800 may include, in 812, modifying at least one property of the write signal set (e.g., at least one property, or more than one property, or all properties, of one or more write voltage pulses), e.g. to provide a write voltage drop having a greater magnitude, and then go back to 804 for repeating the writing sequence. In various aspects, the modification of at least one property of the write signal set in 812 may be dispensed with, and a same write signal set may be provided again in a subsequent repetition (as illustrated with the dashed arrow in FIG. 8).

In the following, various examples are provided that may include one or more aspects described above with reference to a memory cell (e.g., the capacitive memory structure 100, the memory cell 200), a memory cell arrangement (e.g., the memory cell arrangement 600) and a method (e.g., the method 800). It may be intended that aspects described in relation to the memory arrangement may apply also to the method, and vice versa.

Example 1 is a memory cell arrangement including: a memory cell including a field-effect transistor structure and a spontaneous-polarizable memory layer; and a control circuit configured to cause a writing of the memory cell by a writing operation, wherein the writing operation includes: carrying out a writing sequence, the writing sequence including: supplying a write signal set to the memory cell to provide a write voltage drop to bring a threshold voltage associated with the memory cell into a target threshold voltage range by polarizing the spontaneous-polarizable memory layer, and, subsequently, supplying a post-conditioning signal set to the memory cell to provide a post-conditioning voltage drop having opposite polarity with respect to the write voltage drop to change (e.g., increase or decrease) the threshold voltage associated with the memory cell by partially depolarizing the spontaneous-polarizable memory layer; and checking, after carrying out the writing sequence, whether the threshold voltage associated with the memory cell is in the target threshold voltage range, and repeating the writing sequence in the case that the threshold voltage associated with the memory cell is not in the target threshold voltage range.

In the case that the memory cell is a n-type FET memory cell and the writing operation is for writing the memory cell from a high-threshold voltage state to a low-threshold voltage state, the post-conditioning voltage drop may induce a positive shift of the threshold voltage, e.g. may be configured to increase the threshold voltage. In the case that the memory cell is a n-type FET memory cell and the writing operation is for writing the memory cell from a low-threshold voltage state to a high-threshold voltage state, the post-conditioning voltage drop may induce a negative shift of the threshold voltage, e.g. may be configured to decrease the threshold voltage.

In the case that the memory cell is a p-type FET memory cell and the writing operation is for writing the memory cell from a high-threshold voltage state to a low-threshold voltage state, the post-conditioning voltage drop may induce a negative shift of the threshold voltage, e.g. may be configured to decrease the threshold voltage. In the case that the memory cell is a p-type FET memory cell and the writing operation is for writing the memory cell from a high-threshold voltage state to a low-threshold voltage state, the post-conditioning voltage drop may induce a positive shift of the threshold voltage, e.g. may be configured to increase the threshold voltage.

The change of the threshold voltage may include a shift of the threshold voltage in such a way that a size (e.g., a width, a voltage difference) of a memory window associated with the memory cell is decreased.

In Example 2, the memory cell arrangement of example 1 may optionally further include that the writing operation further includes ending the writing operation, in the case that the checking determines that the threshold voltage associated with the memory cell is in the target threshold voltage range.

In Example 3, the memory cell arrangement of example 1 may optionally further include that the writing operation further includes repeating at least the supplying of the write voltage set to the memory cell, in the case that the checking determines that the threshold voltage associated with the memory cell is in the target threshold voltage range.

In Example 4, the memory cell arrangement of any one of examples 1 to 3 may optionally further include that a change of the threshold voltage associated with the partial depolarization of the spontaneous-polarizable memory layer includes a decrease of an absolute value of the threshold voltage, a decrease of a positive threshold voltage value, and/or an increase of a negative threshold voltage value.

In Example 5, the memory cell arrangement of any one of examples 1 to 4 may optionally further include that a change of the threshold voltage associated with the partial depolarization of the spontaneous-polarizable memory layer includes an increase of a voltage difference between an absolute value of the threshold voltage and an absolute value of a target threshold voltage.

In Example 6, the memory cell arrangement of any one of examples 1 to 5 may optionally further include that the post-conditioning voltage drop is configured to change the threshold voltage associated with the memory cell by reducing a remanent polarization of the spontaneous-polarizable memory layer.

In Example 7, the memory cell arrangement of any one of examples 1 to 6 may optionally further include that the post-conditioning voltage drop is configured to reduce a magnitude of the remanent polarization of the spontaneous-polarizable memory layer without causing an inversion of a sign of the remanent polarization of the spontaneous-polarizable memory layer (illustratively, without switching the overall polarization state of the memory layer).

In Example 8, the memory cell arrangement of any one of examples 1 to 7 may optionally further include that the writing scheme is related to a single program operation or a single erase operation for the memory cell.

In Example 9, the memory cell arrangement of any one of examples 1 to 8 may optionally further include that the write voltage drop is configured to flip a memory state the memory cell was residing in before the supplying of the write signal set. Additionally or alternatively, the post-conditioning voltage drop may be configured to maintain a memory state the memory cell is residing in.

In Example 10, the memory cell arrangement of any one of examples 1 to 9 may optionally further include that in an initial writing sequence of a plurality of the writing sequences the write voltage drop has a first polarity, and that in a subsequent writing sequence of the plurality of the writing sequences the write voltage drop has the first polarity.

In Example 11, the memory cell arrangement of any one of examples 1 to 10 may optionally further include that in an initial writing sequence of a plurality of the writing sequences the write voltage drop has a first magnitude, and that in a subsequent writing sequence of the plurality of the writing sequences the write voltage drop has a second magnitude greater than the first magnitude. In some aspects, write voltage drops in different writing sequences may have a same magnitude (e.g., the first write voltage drop may have a first magnitude, and the second write voltage drop may have the same first magnitude).

In Example 12, the memory cell arrangement of any one of examples 1 to 11 may optionally further include that in an initial writing sequence of a plurality of the writing sequences the write signal set includes one or more first write voltage pulses, that in a subsequent writing sequence of the plurality of the writing sequences the write signal set includes one or more second write voltage pulses, and that the one or more first write voltage pulses are different from the one or more second write voltage pulses with respect to one or more (e.g., a plurality, or all) of the following: a pulse height of the one or more first write voltage pulses is different from a pulse height of the one or more second write voltage pulses (e.g., the one or more second write voltage pulses have a greater pulse height), a pulse width of the one or more first write voltage pulses is different from a pulse width of the one or more second write voltage pulses (e.g., the one or more second write voltage pulses have a greater pulse width), a total on-time of the one or more first write voltage pulses is different from a total on-time of the one or more second write voltage pulses (e.g., the one or more second write voltage pulses have a greater total on-time), and/or a number of the one or more first write voltage pulses is different from a number of the one or more second write voltage pulses (e.g., the one or more second write voltage pulses have a greater number of pulses). In some aspects, the properties of the write voltage pulses may be maintained constant among different repetitions of the write sequence, e.g. the first write voltage pulses may have a pulse width equal to the pulse width of the second write voltage pulses, and a pulse height equal to the pulse height of the second write voltage pulses, and a total on-time equal to the total on-time of the second write voltage pulses, and a number of pulses equal to the number of pulses of the second write voltage pulses.

In Example 13, the memory cell arrangement of any one of examples 1 to 12 may optionally further include that in an initial writing sequence of a plurality of the writing sequences the post-conditioning voltage drop has a second polarity, and that in a subsequent writing sequence of the plurality of the writing sequences the post-conditioning voltage drop has the second polarity.

In Example 14, the memory cell arrangement of any one of examples 1 to 13 may optionally further include that in an initial writing sequence of a plurality of the writing sequences the post-conditioning signal set includes one or more first post-conditioning voltage pulses, that in a subsequent writing sequence of the plurality of the writing sequences the post-conditioning signal set includes one or more second post-conditioning voltage pulses, and that the one or more first post-conditioning voltage pulses are equal to the one or more second post-conditioning voltage pulses with respect to at least one of the following: a pulse height of the one or more first post-conditioning voltage pulses is equal to a pulse height of the one or more second post-conditioning voltage pulses, a pulse width of the one or more first post-conditioning voltage pulses is equal to a pulse width of the one or more second post-conditioning voltage pulses, a total on-time of the one or more first post-conditioning voltage pulses is equal to a total on-time of the one or more second post-conditioning voltage pulses, and/or a number of the one or more first post-conditioning voltage pulses is equal to a number of the one or more second post-conditioning voltage pulses.

In Example 15, the memory cell arrangement of any one of examples 1 to 14 may optionally further include that checking whether the threshold voltage associated with the memory cell is in the target threshold voltage range includes supplying a read signal to the memory cell.

In Example 16, the memory cell arrangement of any one of examples 1 to 15 may optionally further include that checking whether the threshold voltage associated with the memory cell is in the target threshold voltage range includes determining whether an absolute value of the threshold voltage associated with the memory cell is equal to or greater than an absolute value of a target threshold voltage.

In Example 17, the memory cell arrangement of any one of examples 1 to 16 may optionally further include that the writing operation is configured to bring the memory cell into a memory state of at least two memory states, the at least two memory states including a first memory state associated with a first threshold voltage and a second memory state associated with a second threshold voltage.

In Example 18, the memory cell arrangement of any one of examples 1 to 17 may optionally further include that a material of the spontaneous-polarizable memory layer includes at least one of the following: a doped transition metal oxide, an undoped transition metal oxide, a doped transition metal nitride, an undoped transition metal nitride, a doped metal nitride, and/or an undoped metal nitride. For example, the material of the spontaneous-polarizable memory layer may include hafnium oxide, zirconium oxide, and/or a mixture of hafnium oxide and zirconium oxide.

In Example 19, the memory cell arrangement of any one of examples 1 to 18 may optionally further include that the memory cell includes: a first electrode; a second electrode; and that the spontaneous-polarizable memory layer is disposed between the first electrode and the second electrode.

In Example 20, the memory cell arrangement of example 19 may optionally further include that the first electrode, the second electrode, and the spontaneous-polarizable memory layer form a capacitive memory structure.

In Example 21, the memory cell arrangement of example 20 may optionally further include that the field-effect transistor structure includes a gate structure coupled to the capacitive memory structure, or that the capacitive memory structure is integrated in the field-effect transistor structure.

In Example 22, the memory cell arrangement of example 20 or 21 may optionally further include that the field-effect transistor structure and the capacitive memory structure are coupled to one another to form a capacitive voltage divider.

In Example 23, the memory cell arrangement of any one of examples 20 to 22 may optionally further include that the gate structure of the field-effect transistor structure includes a gate electrode and a gate isolation separating the gate electrode from a channel region of the field-effect transistor structure, and that the gate electrode is coupled to the first electrode of the capacitive memory structure.

In Example 24, the memory cell arrangement of any one of examples 1 to 23 may optionally further include that the writing operation is for writing the memory cell from a first memory state associated with a first threshold voltage into a second memory state associated with a second threshold voltage, and that a change of the threshold voltage associated with the partial depolarization of the spontaneous-polarizable memory layer includes shift of the second threshold voltage such that an absolute value of a difference between the first threshold voltage and the second threshold voltage is decreased (in other words, reduced). As an example, the first threshold voltage may be the low-threshold voltage, and the second threshold voltage may be the high-threshold voltage. As another example, the first threshold voltage may be the high-threshold voltage, and the second threshold voltage may be the low-threshold voltage.

Example 25 is a memory cell arrangement including: a memory cell including a spontaneous-polarizable memory layer, and a control circuit configured to cause a writing of the memory cell by a single writing operation, wherein the single writing operation includes: carrying out a writing sequence, the writing sequence including: supplying a write signal set to the memory cell to provide a write voltage drop to bring the memory cell in a memory state by polarizing the spontaneous-polarizable memory layer, and, subsequently, supplying a post-conditioning signal set to the memory cell to provide a post-conditioning voltage drop having opposite polarity with respect to the write voltage drop to partially depolarize the spontaneous-polarizable memory layer; and checking, after carrying out the writing sequence, whether the memory cell still resides in the memory state, and either repeating the writing sequence and the checking in the case that the memory cell does not reside in the memory state, or ending the writing operation by repeating only the writing sequence in the case that the memory cell resides in the memory state.

In Example 26, the memory cell arrangement of example 25 may optionally further include one, or some, or all the features of examples 1 to 24.

Example 27 is a memory cell arrangement including: a memory cell including a field-effect transistor structure and a spontaneous-polarizable memory layer; and a control circuit configured to cause a writing of the memory cell by a writing operation, wherein the writing operation includes: carrying out a writing sequence, the writing sequence including: supplying a write signal set to the memory cell to provide a first write voltage drop to bring a threshold voltage associated with the memory cell into a target threshold voltage range by polarizing the spontaneous-polarizable memory layer, and, subsequently, supplying a post-conditioning signal set to the memory cell to provide a first post-conditioning voltage drop having opposite polarity with respect to the first write voltage drop to reduce the threshold voltage associated with the memory cell by partially depolarizing the spontaneous-polarizable memory layer; and checking, after carrying out the writing sequence, whether the threshold voltage associated with the memory cell is in the target threshold voltage range, and, in the case that the threshold voltage associated with the memory cell is not in the target threshold voltage range, supplying the write signal set to the memory cell to provide a second write voltage drop having a greater magnitude with respect to the first write voltage drop, and, subsequently, supplying the post-conditioning signal set to the memory cell to provide a second post-conditioning voltage drop having a same magnitude as the first post-conditioning voltage drop.

In Example 28, the memory cell arrangement of example 27 may optionally further include one, or some, or all the features of examples 1 to 24.

Example 29 is a method of operating a memory cell arrangement, the memory cell arrangement including a memory cell including a field-effect transistor structure and a spontaneous-polarizable memory layer, the method including causing a writing of the memory cell by a writing operation, wherein the writing operation includes carrying out a writing sequence, the writing sequence including: supplying a write signal set to the memory cell to provide a write voltage drop to bring a threshold voltage associated with the memory cell into a target threshold voltage range by polarizing the spontaneous-polarizable memory layer, and, subsequently, supplying a post-conditioning signal set to the memory cell to provide a post-conditioning voltage drop having opposite polarity with respect to the write voltage drop to change (e.g., increase or decrease) the threshold voltage associated with the memory cell by partially depolarizing the spontaneous-polarizable memory layer; and checking, after carrying out the writing sequence, whether the threshold voltage associated with the memory cell is in the target threshold voltage range, and repeating the writing sequence in the case that the threshold voltage associated with the memory cell is not in the target threshold voltage range.

Example 30 is a method of writing a memory cell, the method including: bringing a memory cell into a memory state of at least two memory states by applying a write signal set to the memory cell; verifying a robustness of the memory state by applying a set of disturb signal set to the memory cell after the memory cell is brought into the memory state; and either ending the writing of the memory cell in the case that the robustness of the memory state is verified or applying a further write signal set to the memory cell to bring the memory cell into a more robust memory state.

In Example 31, the method of example 30 may optionally further include that the memory cell includes a spontaneous-polarizable memory layer; that the write signal set is configured to provide a write voltage drop at the memory cell to polarize the spontaneous-polarizable memory layer; that the disturb signal set is configured to provide a disturb voltage drop at the memory cell to partially depolarize the spontaneous-polarizable memory layer; and that the further write signal set is configured to provide a further write voltage drop at the memory cell, the further write voltage drop having a greater magnitude with respect to the (initial) write voltage drop to provide a stronger polarization of the spontaneous-polarizable memory layer.

The term "connected" may be used herein with respect to nodes, terminals, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g. provided by a metal or degenerate semiconductor in absence of p-n junctions in the current path. The term "electrically conductively connected" may be also referred to as "galvanically connected".

The term region used with regards to a "source region", "drain region", "channel region", and the like, may be used herein to mean a continuous region of a semiconductor portion (e.g., of a semiconductor wafer or a part of a semiconductor wafer, a semiconductor layer, a fin, a semiconductor nanosheet, a semiconductor nanowire, etc.). In some aspects, the continuous region of a semiconductor portion may be provided by semiconductor material having only one dominant doping type.

The term "metal material" may be used herein to describe a metal (e.g., a pure or substantially pure metal), a mixture of more than one metal, a metal alloy, an intermetallic material, a conductive metal compound (e.g., a nitride), and the like. Illustratively, the term "metal material" may be used herein to describe a material having an electrical conductivity typical of a metal, for example an electrical conductivity greater than $10^6$ S/m at a temperature of 20° C. The term "metal material" may be used herein to describe a material having the Fermi level inside at least one band.

In various aspects, reference may be made to the position of a memory cell within a memory cell arrangement. The notation may be based on a matrix disposition of the memory cells in the memory cell arrangement. Illustratively, the memory cell in position (1,1) may be the memory cell in the top left corner (as represented in the figures) of the memory cell arrangement, the memory cell in position (1,2) may be the memory cell immediately to the right of the memory cell in position (1,1), etc. The memory cell in position (1,1) may be the memory cell in the first row and first column of the memory cell arrangement, the memory cell in position (1,2) may be the memory cell in the first row and second column of the memory cell arrangement, etc.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. Memory cell arrangement comprising:
   a memory cell comprising a field-effect transistor structure and a spontaneous-polarizable memory layer; and
   a control circuit configured to cause a writing of the memory cell by a writing operation, wherein the writing operation comprises:
   carrying out a writing sequence, the writing sequence comprising:
      supplying a write signal set to the memory cell to provide a write voltage drop to bring a threshold voltage associated with the memory cell into a target threshold voltage range by polarizing the spontaneous-polarizable memory layer, and, subsequently,
      supplying a post-conditioning signal set to the memory cell to provide a post-conditioning voltage drop having opposite polarity with respect to the write voltage drop to change the threshold voltage associated with the memory cell by partially depolarizing the spontaneous-polarizable memory layer; and
   checking, after carrying out the writing sequence, whether the threshold voltage associated with the memory cell is in the target threshold voltage range, and repeating the writing sequence in the case that the threshold voltage associated with the memory cell is not in the target threshold voltage range.

2. Memory cell arrangement according to claim 1, wherein the writing operation further comprises ending the writing operation, in the case that the checking determines that the threshold voltage associated with the memory cell is in the target threshold voltage range.

3. Memory cell arrangement according to claim 1, wherein the writing operation further comprises repeating at least the supplying of the write voltage set to the memory cell, in the case that the checking determines that the threshold voltage associated with the memory cell is in the target threshold voltage range.

4. Memory cell arrangement according to claim 1, wherein a change of the threshold voltage comprises a shift of the threshold voltage in such a way that a width of a memory window associated with the memory cell is decreased.

5. Memory cell arrangement according to claim 1, wherein the post-conditioning voltage drop is configured to change the threshold voltage associated with the memory cell by reducing a remanent polarization of the spontaneous-polarizable memory layer.

6. Memory cell arrangement according to claim 1, wherein the writing operation is for writing the memory cell from a first memory state associated with a first threshold voltage into a second memory state associated with a second threshold voltage, and
wherein a change of the threshold voltage associated with the partial depolarization of the spontaneous-polarizable memory layer comprises shift of the second threshold voltage such that an absolute value of a difference between the first threshold voltage and the second threshold voltage is decreased.

7. Memory cell arrangement according to claim 5, wherein the post-conditioning voltage drop is configured to reduce a magnitude of the remanent polarization of the spontaneous-polarizable memory layer without causing an inversion of a sign of the remanent polarization of the spontaneous-polarizable memory layer.

8. Memory cell arrangement according to claim 1, wherein the writing operation is related to a single program operation or a single erase operation for the memory cell.

9. Memory cell arrangement according to claim 1, wherein the write voltage drop is configured to flip a memory state the memory cell was residing in before the supplying of the write signal set, and/or
wherein the post-conditioning voltage drop is configured to maintain a memory state the memory cell is residing in.

10. Memory cell arrangement according to claim 1, wherein in an initial writing sequence of a plurality of the writing sequences the write voltage drop has a first polarity, and
wherein in a subsequent writing sequence of the plurality of the writing sequences the write voltage drop has the first polarity.

11. Memory cell arrangement according to claim 10, wherein the write voltage drop of the subsequent writing sequence has a greater magnitude with respect to the write voltage drop of the initial writing sequence.

12. Memory cell arrangement according to claim 1, wherein in an initial writing sequence of a plurality of the writing sequences the write signal set comprises one or more first write voltage pulses, and wherein in a subsequent writing sequence of the plurality of the writing sequences the write signal set comprises one or more second write voltage pulses,
wherein the one or more first write voltage pulses are different from the one or more second write voltage pulses with respect to at least one of the following:

a pulse height of the one or more first write voltage pulses is different from a pulse height of the one or more second write voltage pulses, a pulse width of the one or more first write voltage pulses is different from a pulse width of the one or more second write voltage pulses, a total on-time of the one or more first write voltage pulses is different from a total on-time of the one or more second write voltage pulses, and/or a number of the one or more first write voltage pulses is different from a number of the one or more second write voltage pulses.

13. Memory cell arrangement according to claim 1,
wherein in an initial writing sequence of a plurality of the writing sequences the post-conditioning voltage drop has a second polarity, and
wherein in a subsequent writing sequence of the plurality of the writing sequences the post-conditioning voltage drop has the second polarity.

14. Memory cell arrangement according to claim 1,
wherein in an initial writing sequence of a plurality of the writing sequences the post-conditioning signal set comprises one or more first post-conditioning voltage pulses, and wherein in a subsequent writing sequence of the plurality of the writing sequences the post-conditioning signal set comprises one or more second post-conditioning voltage pulses,
wherein the one or more first post-conditioning voltage pulses are equal to the one or more second post-conditioning voltage pulses with respect to one or more of the following:
a pulse height of the one or more first post-conditioning voltage pulses is equal to a pulse height of the one or more second post-conditioning voltage pulses,
a pulse width of the one or more first post-conditioning voltage pulses is equal to a pulse width of the one or more second post-conditioning voltage pulses,
a total on-time of the one or more first post-conditioning voltage pulses is equal to a total on-time of the one or more second post-conditioning voltage pulses, and/or
a number of the one or more first post-conditioning voltage pulses is equal to a number of the one or more second post-conditioning voltage pulses.

15. Memory cell arrangement according to claim 1,
wherein checking whether the threshold voltage associated with the memory cell is in the target threshold voltage range comprises supplying a read signal to the memory cell.

16. Memory cell arrangement according to claim 1,
wherein the memory cell comprises:
a first electrode and a second electrode;
wherein the first electrode, the second electrode, and the spontaneous-polarizable memory layer form a capacitive memory structure.

17. Memory cell arrangement according to claim 16,
wherein the field-effect transistor structure comprises a gate structure coupled to the capacitive memory structure, or wherein the capacitive memory structure is integrated in the field-effect transistor structure.

18. Memory cell arrangement comprising:
a memory cell comprising a spontaneous-polarizable memory layer, and
a control circuit configured to cause a writing of the memory cell by a single writing operation, wherein the single writing operation comprises:
carrying out a writing sequence, the writing sequence comprising:
supplying a write signal set to the memory cell to provide a write voltage drop to bring the memory cell in a memory state by polarizing the spontaneous-polarizable memory layer, and, subsequently,
supplying a post-conditioning signal set to the memory cell to provide a post-conditioning voltage drop having opposite polarity with respect to the write voltage drop to partially depolarize the spontaneous-polarizable memory layer; and
checking, after carrying out the writing sequence, whether the memory cell still resides in the memory state, and either repeating the writing sequence and the checking in the case that the memory cell does not reside in the memory state, or ending the single writing operation by repeating only the writing sequence in the case that the memory cell resides in the memory state.

19. A method of writing a memory cell, the method comprising:
bringing a memory cell into a memory state of at least two memory states by applying a write signal set to the memory cell;
verifying a robustness of the memory state by applying a disturb signal set to the memory cell after the memory cell is brought into the memory state; and
either ending the writing of the memory cell in the case that the robustness of the memory state is verified or applying a further write signal set to the memory cell to bring the memory cell into a more robust memory state.

20. The method according to claim 19,
wherein the memory cell comprises a spontaneous-polarizable memory layer;
wherein the write signal set is configured to provide a write voltage drop at the memory cell to polarize the spontaneous-polarizable memory layer;
wherein the disturb signal is set to configured to provide a disturb voltage drop at the memory cell to partially depolarize the spontaneous-polarizable memory layer; and
wherein the further write signal set is configured to provide a further write voltage drop at the memory cell, the further write voltage drop having a greater magnitude with respect to the write voltage drop to provide a stronger polarization of the spontaneous-polarizable memory layer.

* * * * *

UNITED STATES PATENT AND TRADEMARK OFFICE
CERTIFICATE OF CORRECTION

| | | |
|---|---|---|
| PATENT NO. | : 11,475,935 B1 | Page 1 of 1 |
| APPLICATION NO. | : 17/341880 | |
| DATED | : October 18, 2022 | |
| INVENTOR(S) | : Johannes Ocker | |

It is certified that error appears in the above-identified patent and that said Letters Patent is hereby corrected as shown below:

In the Claims

Claim 20, Column 42, Line 46 delete "is set to configured", insert --set is configured--

Signed and Sealed this
Thirty-first Day of January, 2023

Katherine Kelly Vidal
*Director of the United States Patent and Trademark Office*